(12) United States Patent
Gwon et al.

(10) Patent No.: US 10,978,522 B2
(45) Date of Patent: *Apr. 13, 2021

(54) DISPLAY DEVICE AND METHOD FOR MANUFACTURING THE SAME

(71) Applicant: LG Display Co., Ltd., Seoul (KR)

(72) Inventors: Hyangmyoung Gwon, Paju-si (KR); Byonghoo Kim, Paju-si (KR); Sangheun Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/000,250

(22) Filed: Aug. 21, 2020

(65) Prior Publication Data

US 2020/0395417 A1 Dec. 17, 2020

Related U.S. Application Data

(63) Continuation of application No. 16/796,224, filed on Feb. 20, 2020, now Pat. No. 10,784,318, which is a (Continued)

(30) Foreign Application Priority Data

Jun. 14, 2017 (KR) ........................ 10-2017-0074614

(51) Int. Cl.
*H01L 27/32* (2006.01)
*G06F 3/044* (2006.01)
(Continued)

(52) U.S. Cl.
CPC ............ *H01L 27/323* (2013.01); *G06F 3/044* (2013.01); *G06F 3/0412* (2013.01);
(Continued)

(58) Field of Classification Search
CPC ... H01L 27/323; H01L 51/56; H01L 27/3246; H01L 27/3262; H01L 51/5206;
(Continued)

(56) References Cited

U.S. PATENT DOCUMENTS 10,007,370 B2 6/2018 Park et al.
2012/0105340 A1 5/2012 Beom et al.
(Continued)

FOREIGN PATENT DOCUMENTS

CN 102467852 A 5/2012
CN 106057853 A 10/2016
(Continued)

OTHER PUBLICATIONS

Chinese Office Action dated Nov. 14, 2019 issued in corresponding Application No. 201810607526.4 (18 pages).
(Continued)

*Primary Examiner* — Muhammad N Edun
(74) *Attorney, Agent, or Firm* — Polsinelli PC

(57) ABSTRACT

A display device and a method for manufacturing the same are disclosed, which may prevent a crack from occurring on an inorganic film constituting an encapsulation film and prevent a residual film from occurring. The display device comprises a substrate including a display area on which pixels area arranged, and a non-display area surrounding the display area; an encapsulation film covering the display area and including an organic film; a first dam arranged to be in contact with the encapsulation film, having a second side which is an opposite side of a first side facing the organic film and has an inclination smaller than 90°; and a metal pattern pattern-formed on the first dam.

10 Claims, 15 Drawing Sheets

Related U.S. Application Data continuation of application No. 16/008,300, filed on Jun. 14, 2018, now Pat. No. 10,608,058.

(51) Int. Cl.
*G06F 3/041* (2006.01)
*G09G 3/3291* (2016.01)
*H01L 51/50* (2006.01)
*H01L 51/52* (2006.01)
*H01L 51/56* (2006.01)

(52) U.S. Cl.
CPC ....... *G09G 3/3291* (2013.01); *H01L 27/3246* (2013.01); *H01L 27/3258* (2013.01); *H01L 27/3262* (2013.01); *H01L 51/5036* (2013.01); *H01L 51/5056* (2013.01); *H01L 51/5072* (2013.01); *H01L 51/5206* (2013.01); *H01L 51/5234* (2013.01); *H01L 51/5237* (2013.01); *H01L 51/5256* (2013.01); *H01L 51/56* (2013.01); *G06F 2203/04103* (2013.01); *G06F 2203/04111* (2013.01); *G09G 2310/08* (2013.01)

(58) Field of Classification Search
CPC ............. H01L 51/5036; H01L 51/5237; H01L 51/5072; H01L 51/5234; H01L 51/5056; H01L 27/3258; H01L 51/5256; G06F 3/0412; G06F 2203/04111; G06F 3/044; G06F 2203/04103; G09G 3/3291; G09G 2310/08

See application file for complete search history.

(56) References Cited

U.S. PATENT DOCUMENTS

| | | |
|---|---|---|
| 2015/0227170 A1 | 8/2015 | Kim et al. |
| 2016/0307971 A1 | 10/2016 | Jeon |
| 2018/0059862 A1 | 3/2018 | Zeng et al. |
| 2018/0090714 A1 | 3/2018 | Kim et al. |

FOREIGN PATENT DOCUMENTS

| | | |
|---|---|---|
| KR | 1020160000853 A | 1/2016 |
| KR | 1020160043230 A | 4/2016 |

OTHER PUBLICATIONS

Ohinese Office Action dated Nov. 14, 2019 issued in corresponding Application No. 201810607526.4 (18 pages).

Korean Office Action dated Nov. 30, 2020 issued in Patent Application No. 10-2017-0074614 (7 pages).

DISPLAY DEVICE AND METHOD FOR MANUFACTURING THE SAME

CROSS REFERENCE TO RELATED APPLICATIONS

This application is a continuation of U.S. patent application Ser. No. 16/796,224 filed Feb. 20, 2020, which is a continuation of U.S. patent application Ser. No. 16/008,300 filed on Jun. 14, 2018, now U.S. Pat. No. 10,608,058, which claims the benefit of the Korean Patent Application No. 10-2017-0074614 filed on Jun. 14, 2017, all of which are hereby incorporated by reference in their entireties for all purposes as if fully set forth herein.

BACKGROUND

Field of the Disclosure

The present disclosure relates to a display device and a method for manufacturing the same.

Description of the Background

With the advancement of the information age, a demand for a display device for displaying an image has been increased in various forms. Therefore, various display devices such as liquid crystal display (LCD) devices, plasma display panel (PDP) devices, and organic light emitting display (OLED) devices have been used.

Among the display devices, the organic light emitting display device is a self-light emitting device, and has advantages in that a viewing angle and a contrast ratio are greater than those of the liquid crystal display (LCD) device. Also, since the organic light emitting display device does not require a separate backlight, it is advantageous that the organic light emitting display device can be fabricated thin and lightweight and has low power consumption. Furthermore, the organic light emitting display device has advantages in that it can be driven at a low direct current voltage, has a fast response speed, and especially has a low manufacturing cost.

However, the organic light emitting display device includes pixels, each of which includes an organic light emitting diode, and has a disadvantage in that the organic light emitting diode may be easily degraded by external factors such as external water and oxygen. In order to prevent this, the organic light emitting display device forms an encapsulation film to prevent the external water and oxygen from being permeated into the organic light emitting diode.

The encapsulation film includes at least one inorganic film and at least one organic film to prevent oxygen or water from being permeated into an organic light emitting layer and an electrode. At this time, at least one organic film generally includes a polymer layer, and is formed by a hardening process after being doped on the substrate in a liquid type. Since such an organic film has flexibility until the hardening process is performed, a problem may occur in that the organic film may overflow outside an area where the encapsulation film is to be formed. To solve this problem, a dam for blocking a flow of the organic film is formed along the outside of the organic light emitting diode.

Meanwhile, when a dam is formed as above, the organic light emitting display device has an uneven surface to be deposited because a step difference is generated by the dam. Therefore, if another layer is deposited on the dam, other problems can occur as follows.

First of all, in the case that the inorganic film forming the encapsulation layer is deposited on the dam, a problem occurs in that it is difficult to form the inorganic film at a constant thickness. Particularly, the inorganic film is formed more thinly in an area where the substrate and the dam are in contact with each other, whereby a crack may occur. The crack may be propagated into the inside along the inorganic film by external impact, and water and oxygen entering the inside along the propagated crack may cause a dark spot and a dark line spot.

Also, in the case that metal patterns are formed on the dam through a process using photoresist pattern, a problem can occur in that metal patterns may not be completely removed from the area where metal should be removed and thus remains as a residual film.

SUMMARY

Accordingly, the present disclosure is directed to a display device and a method for manufacturing the same, which substantially obviate one or more problems due to limitations and disadvantages of the related art.

More specifically, the present disclosure is to provide a display device that can prevent a residual film from occurring and a method for manufacturing the same.

Further, the present disclosure is to provide a display device that can prevent a crack from occurring on an inorganic film constituting an encapsulation film and a method for manufacturing the same.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

A display device according to one aspect of the present disclosure comprises a substrate including a display area on which pixels area arranged, and a non-display area surrounding the display area; an encapsulation film covering the display area and including an organic film; a first dam arranged to be in contact with the encapsulation film, having a second side which is an opposite side of a first side facing the encapsulation film and has an inclination smaller than 90°; and a metal pattern pattern-formed on the first dam.

A method for manufacturing a display device according to another aspect of the present disclosure comprises the steps of forming a substrate including a display area on which pixels area arranged, and a non-display area surrounding the display area; forming a dam including at least one side of the non-display area with an inclination; forming an organic film inside the dam to cover the display area; and forming a first touch electrode and a second touch electrode on the organic film and the dam.

A display device including a display area where a plurality of pixels is arranged and a non-display area surrounding the display area on a substrate according to another embodiment of the present disclosure comprises an encapsulation film covering the display area and including an organic film and an inorganic film covering the organic film; a plurality of first touch electrodes and second touch electrodes spaced apart from one another and disposed on the encapsulation film; a plurality of bridge electrodes connecting the plurality of first touch electrodes and second touch electrodes; a first dam contacting the encapsulation film at the non-display area and having first and second side surfaces, wherein the first side surface faces the encapsulation film and the second side surface has an inclination smaller than that of the first side surface; and a metal pattern disposed on the first dam and extended from at least one of the plurality of first touch electrodes and the second touch electrodes.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION OF THE DISCLOSURE

Figure 1:
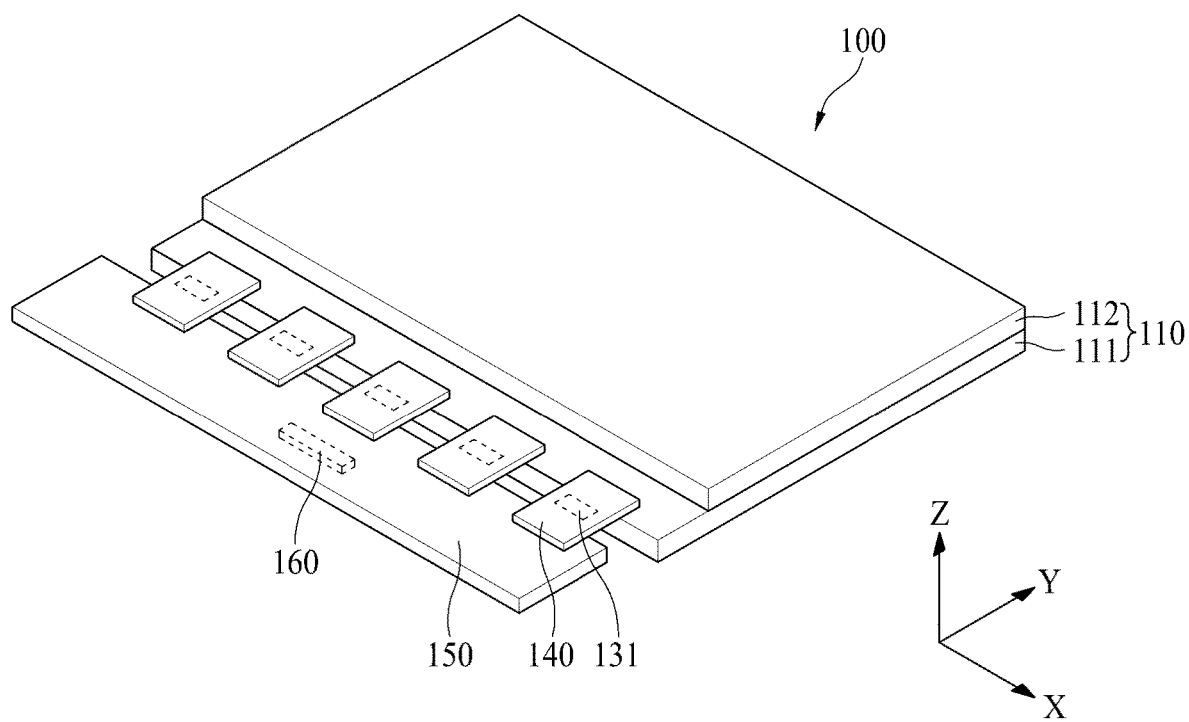
FIG. 1 is a perspective view illustrating a display device according to an aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~%', 'above', 'below~%', and 'next to~', one or more portions may be arranged between two other portions unless 'just' or 'direct' is used.

In describing a time relationship, for example, when the temporal order is described as 'after~', 'subsequent', 'next~', and 'before~%', a case which is not continuous may be included unless 'just' or 'direct' is used.

It will be understood that, although the terms "first", "second", etc. may be used herein to describe various elements, these elements should not be limited by these terms. These terms are only used to distinguish one element from another element. For example, a first element could be termed a second element, and, similarly, a second element could be termed a first element, without departing from the scope of the present disclosure.

"X-axis direction", "Y-axis direction" and "Z-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, the preferred aspects of the present disclosure will be described in detail with reference to the accompanying drawings.

Figure 2:
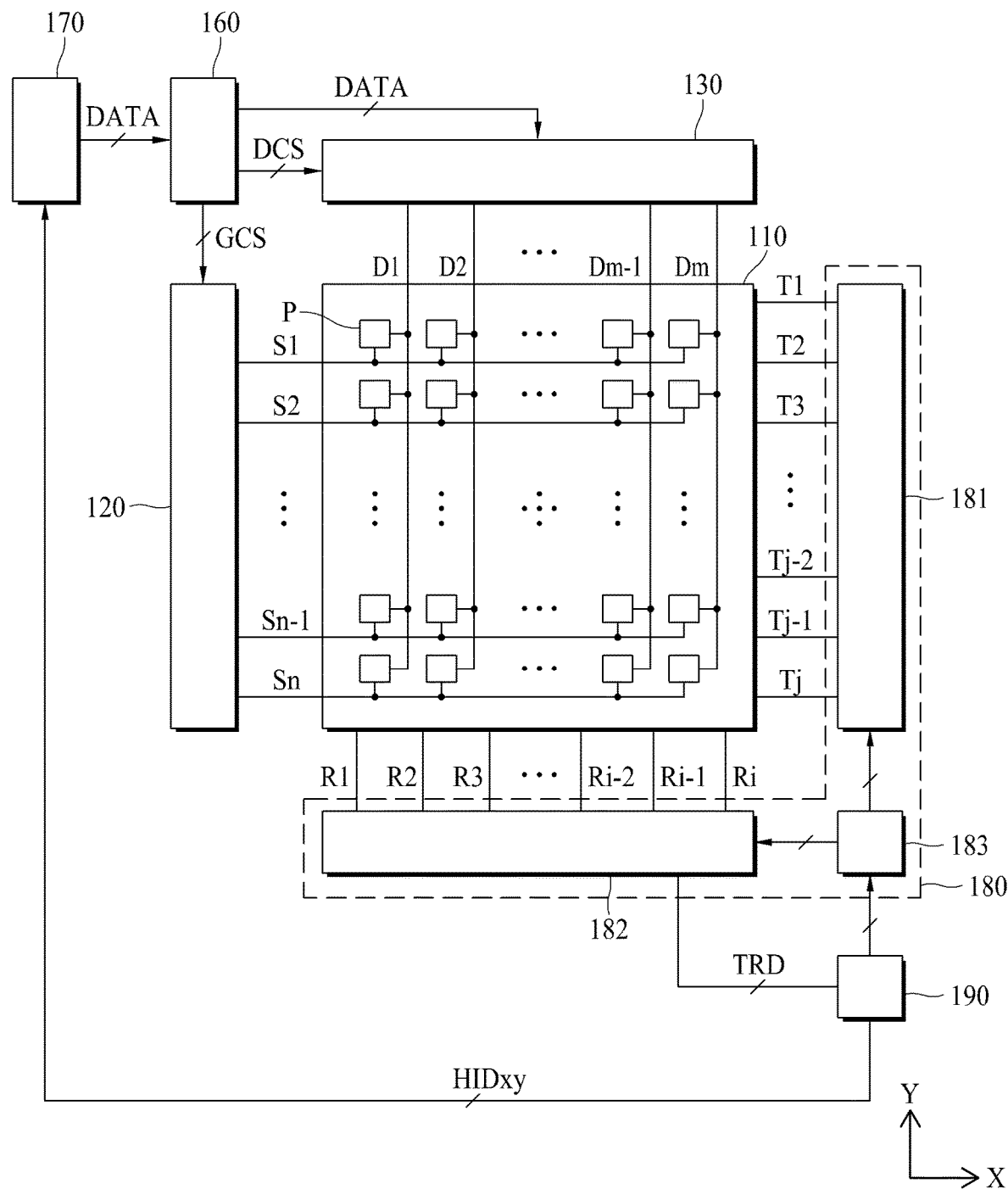
FIG. 2 is a block view briefly illustrating a display device according to an aspect of the present disclosure.

FIG. 1 is a perspective view illustrating a display device according to an aspect of the present disclosure. FIG. 2 is a block view illustrating a display device according to an aspect of the present disclosure.

Referring to FIGS. 1 and 2, the display device according to an aspect of the present disclosure includes a display panel 110, a scan driver 120, a data driver 130, a timing controller 160, a host system 170, a touch driver 180, and a touch coordinate calculator 190.

The display device with built-in touch screen according to an aspect of the present disclosure may be realized as a flat panel display device such as a Liquid Crystal Display (LCD), a Field Emission Display (FED), a Plasma Display Panel (PDP), an Organic Light Emitting Display (OLED), and an Electrophoresis display (EPD). Hereinafter, the display device with built-in touch screen according to an aspect of the present disclosure is realized as, but not limited to, an organic light emitting display device.

The display panel 110 includes a display area on which pixels P are arranged to display an image. On the display area 110, data lines D1 to Dm (m is a positive integer of 2 or more) and scan lines S1 to Sn (n is a positive integer of 2 or more) are formed. The data lines D1 to Dm may be formed to cross the scan lines S1 to Sn. The pixels P may be formed on the area defined by a crossed structure of the gate lines and data lines.

Each of the pixels P of the display panel 110 may be connected to any one of the data lines D1 to Dm and any one of the scan lines S1 to Sn. Each of the pixels P of the display panel 110 may include a driving transistor for controlling a drain-source current in accordance with a data voltage applied to a gate electrode, a scan transistor turned on by a scan signal of the scan line, supplying a data voltage of the data line to the gate electrode of the driving transistor, an organic light emitting diode for emitting light in accordance with the drain-source current of the driving transistor, and a capacitor for storing a voltage of the gate electrode of the driving transistor. Therefore, each of the pixels P may emit light in accordance with the current supplied to the organic light emitting diode.

The scan driver 120 receives a scan control signal GCS from the timing controller 160. The scan driver 120 supplies scan signals to the scan lines S1~Sn in accordance with the scan control signal GCS.

The scan driver 120 may be formed in a non-display area outside one side or both sides of a display area of the display panel 110 in a GIP (gate driver in panel) mode. Alternatively, the scan driver 120 is fabricated of a driving chip, packaged in a flexible film, and may be attached to the non-display area outside one side or both sides of the display area of the display panel 110 in a TAB (tape automated bonding) mode.

The data driver 130 receives digital video data DATA and a data control signal DCS from the timing controller 160. The data driver 130 converts the digital video data DATA into an analogue positive polarity/negative polarity data voltage in accordance with the data control signal DCS and supplies them to the data lines. That is, pixels to which the data voltages will be supplied are selected by the scan signals of the scan driver 120, and the data voltages are supplied to the selected pixels.

The data driver 130 may include a plurality of source drive ICs 131 as shown in FIG. 1. Each of the plurality of source drive ICs 131 may be packaged into the flexible film 140 in a COF (chip on film) or COP (chip on plastic) mode. The flexible film 140 is attached onto pads provided on the non-display area of the display panel 110 using an anisotropic conducting film, whereby the source drives ICs 131 may be connected to the pads.

The circuit board 150 may be attached to the flexible films 140. A plurality of circuits realized as driving chips may be packaged onto the circuit board 150. For example, the timing controller 160 may be packaged onto the circuit board 150. The circuit board 150 may be a printed circuit board or flexible printed circuit board.

The timing controller 160 receives digital video data DATA and timing signals from the host system 170. The timing signals may include a vertical synchronization signal, a horizontal synchronization signal, a data enable signal, and a dot clock. The vertical synchronization signal is a signal defining one frame period. The horizontal synchronization signal is a signal defining one horizontal period needed to supply the data voltages to pixels of one horizontal line of the display panel DIS. The data enable signal is a signal defining a period of inputting available data. The dot clock is a signal repeated with a predetermined short period.

In order to control operation timings of the scan driver 120 and the data driver 130, the timing controller 160 generates a data control signal DCS to control operation timing of the data driver 130 and a scan control signal GCS for controlling operation timing of the data driver 130 based on the timing signals. The timing controller 160 outputs the scan control signal GCS to the scan driver 120 and outputs the digital video data DATA and the data control signal DCS to the data driver 130.

The host system 170 may be realized as a navigation system, a set-top box, a DVD player, a Blu-ray player, a personal computer (PC), a home theater system, a broadcasting receiver, and a phone system. The host system 170 includes SoC (System on chip) equipped with a scaler and converts the digital video data of an input image to a format suitable to display the display panel 110. The host system 170 transfers the digital video data DATA and the timing signals to the timing controller 160.

On the display panel 110, not only the data lines D1 to Dm and the scan lines S1 to Sn but also first and the second touch electrodes may be formed. The first touch electrodes may be formed to cross the second touch electrodes. The first touch electrodes may be connected to a first touch driver 181 through first touch lines T1 to Tj, where j is an integer equal to or greater than 2. The second touch electrodes may be connected to the second touch driver 182 through second touch lines R1 to Ri, where i is an integer equal to or greater than 2. On each of the intersections between the first touch electrodes and the second touch electrodes, a touch sensor may be formed. The touch sensor according to the aspect of the present disclosure is realized as, but not limited to, a mutual capacitance. The first and the second touch electrodes will be described later in more detail with reference to FIG. 5.

The touch driver 180 supplies a driving pulse to the first touch electrodes through the first touch lines T1 to Tj and senses the amount of charge changes in each of the touch sensors through the second touch lines R1 to Ri. That is, in FIG. 2, description will be given based on that the first touch lines T1 to Tj are Tx lines for supplying a driving pulse and the second touch lines R1 to Ri are Rx lines for sensing the amount of charge changes in in each of the touch sensors.

The touch driver 40 includes the first touch driver 181, the second touch driver 182, and the touch controller 183. The first touch driver 181, the second touch driver 182, and the touch controller 183 may be integrated into one ROIC (Read-out IC).

The first touch driver 181 selects the first touch line to output a driving pulse under the control of the touch controller 183 and supplies the driving pulse to the selected first touch line. For example, the first touch driver 181 may sequentially supply driving pulses to the first touch lines T1 to Tj.

The second touch driver 182 selects the second touch lines to receive the amount of charge changes in the touch sensors under the control of the touch controller 183 and receives the amount of charge changes in the touch sensors through the selected second touch lines. The second touch driver 182 converts the amount of charge changes in the touch sensors, which are received through the second touch lines R1 to Ri, to touch raw data TRD which is digital data by sampling the amount of charge changes in the touch sensors.

The touch controller 183 may generate a Tx setup signal in the first touch driver 181 to set up the first touch line to which the driving pulse is to be output and an Rx setup signal in the second touch line to set up the second touch line in which a touch sensor voltage is to be received. Also, the touch controller 183 generates timing control signals to control operation timings of the first touch driver 181 and the second touch driver 182.

The touch coordinate calculator 190 receives touch raw data TRD from the touch driver 180. The touch coordinate calculator 190 calculates touch coordinates in accordance with a touch coordinate calculating method and outputs touch coordinate data HIDxy including information of touch coordinates to the host system 170.

The touch coordinate calculator 190 may be realized as a Micro Controller Unit (MCU). The host system 170 analyzes touch coordinate data HIDxy input from the touch coordinate calculator 190 and executes an application program connected with a coordinate where a touch is generated by a user. The host system 170 transmits the digital video data DATA and the timing signals to the timing controller 160 in accordance with the executed application program.

The touch driver 180 may be included in the source drive ICs 131 or may be fabricated of a separate drive chip and packaged onto the circuit board 150. Also, the touch coordinate calculator 190 may be fabricated of a driving chip and packaged onto the circuit board 150.

Figure 3:
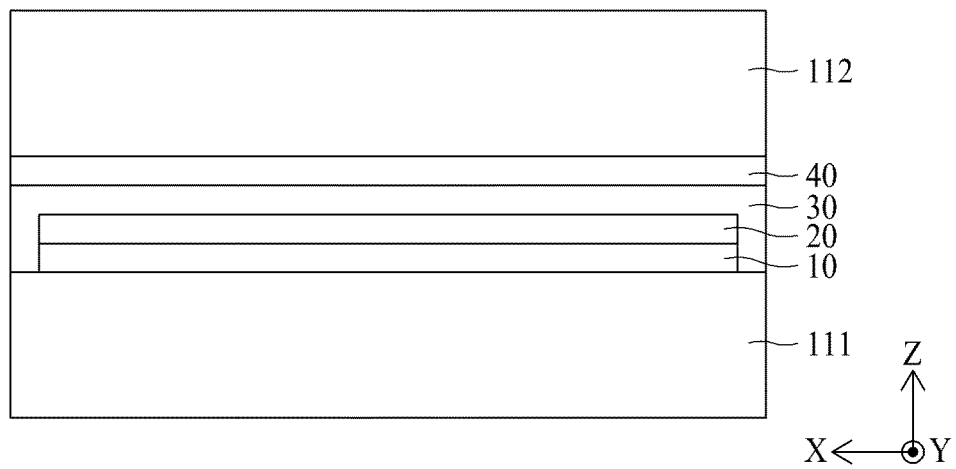
FIG. 3 is a cross-sectional view briefly illustrating one side of a display panel in FIG. 1.

FIG. 3 is a cross-sectional view briefly illustrating one side of a display panel in FIG. 1.

Referring to FIG. 3, the display panel 110 may include a first substrate 111, a second substrate 112, a thin film transistor layer 10 arranged between the first and second substrates 111 and 112, an organic light emitting diode layer 20, an encapsulation layer 30, and a touch sensing layer 40.

The first substrate 111 may be a plastic film or a glass substrate.

The thin film transistor layer 10 is formed on the first substrate 111. The thin film transistor layer 10 may include pluralities of scan lines, data lines, and thin film transistors. Each of the thin film transistors includes a gate electrode, a semiconductor layer, source and drain electrodes. In the case that a scan driver is formed using a GIP (gate driver in panel) method, the scan driver may be formed together with the thin film transistor layer 10.

The organic light emitting diode layer 20 is formed on the thin film transistor 10. The organic light emitting diode layer 20 includes first electrodes, an organic light emitting layer, a second electrode, and banks. Each of the organic light emitting layers may include a hole transporting layer, an organic light emitting layer, and an electron transporting layer. In this case, when a voltage is applied to the first electrode and the second electrode, holes and electrons are moved to the light emitting layer through the hole transporting layer and the electron transporting layer, respectively and are combined in the organic light emitting layer, thereby emitting light. Since pixels are arranged on the area where the organic light emitting diode layer 20 is formed, the area where the organic light emitting diode layer 20 is formed may be defined as the display area. An area in the periphery of the display area may be defined as the non-display area.

The encapsulation layer 30 is formed on the organic light emitting diode layer 20. The encapsulation layer 30 serves to prevent oxygen and water from being permeated into the organic light emitting diode layer 20. The encapsulation may include at least one inorganic film.

The touch sensing layer 40 is formed on the encapsulation layer 30. The touch sensing layer 40 includes first and the second touch electrodes for sensing a touch of a user, and may include bridge electrodes for electrically connecting the first touch electrodes or the second touch electrodes.

Hereafter, the encapsulation layer 30 and the touch sensing layer 40 according to an aspect of the present disclosure will be described in more detail with reference to FIGS. 4 and 9.

Figure 4:
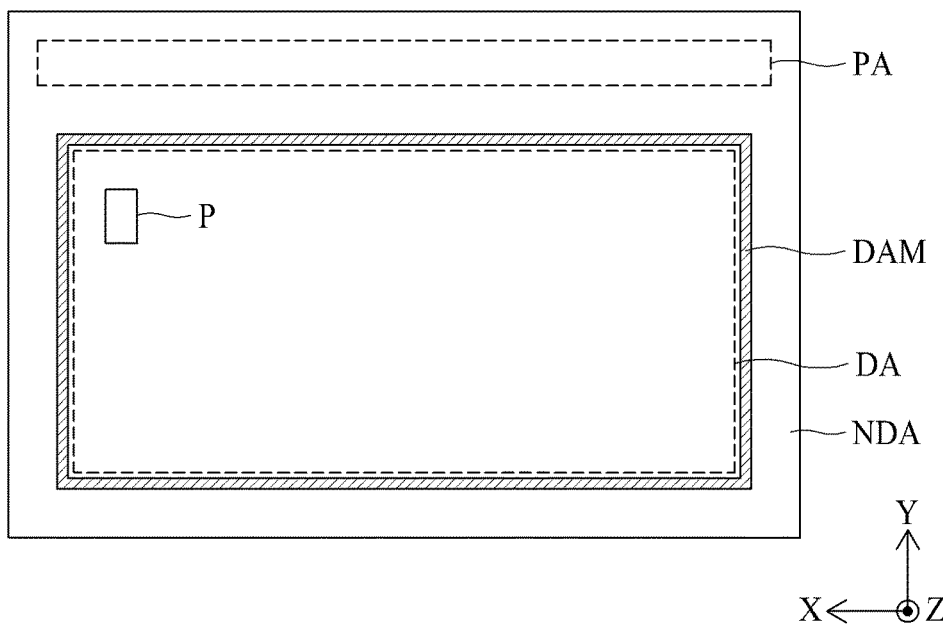
FIG. 4 is a plane view briefly illustrating a first substrate according to an aspect of the present disclosure.
Figure 5:
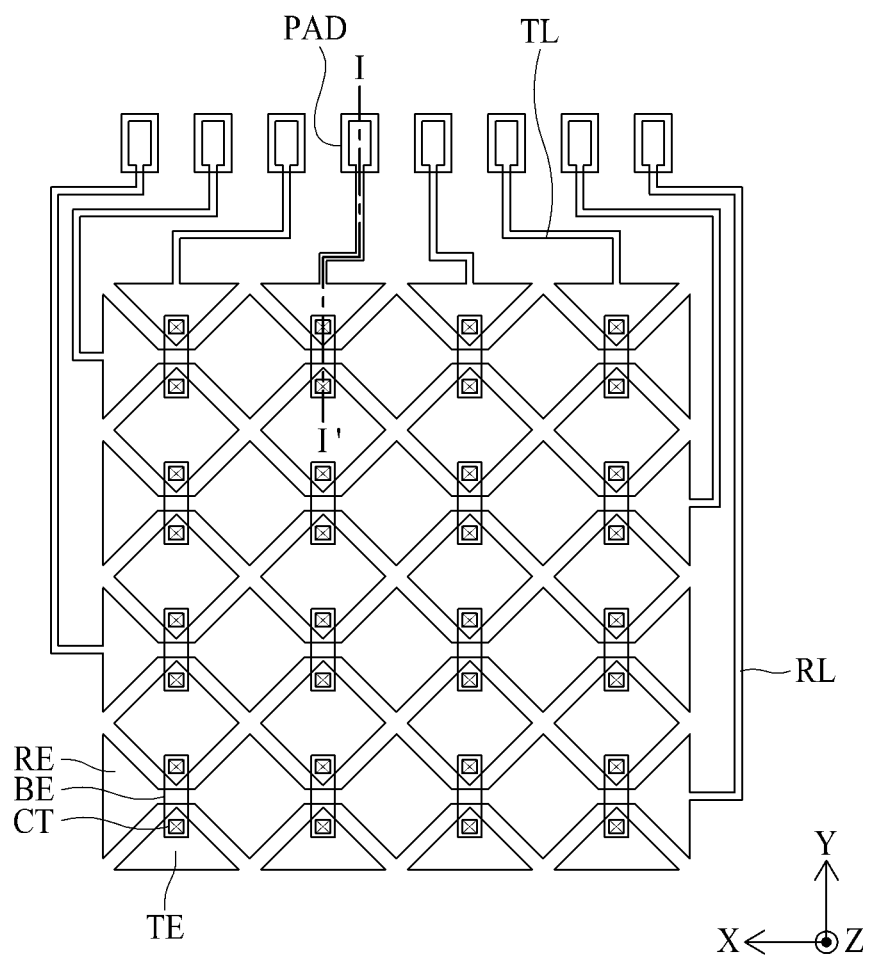
FIG. 5 is a plane view illustrating a touch sensing layer arranged on the first substrate in FIG. 4.
Figure 6:
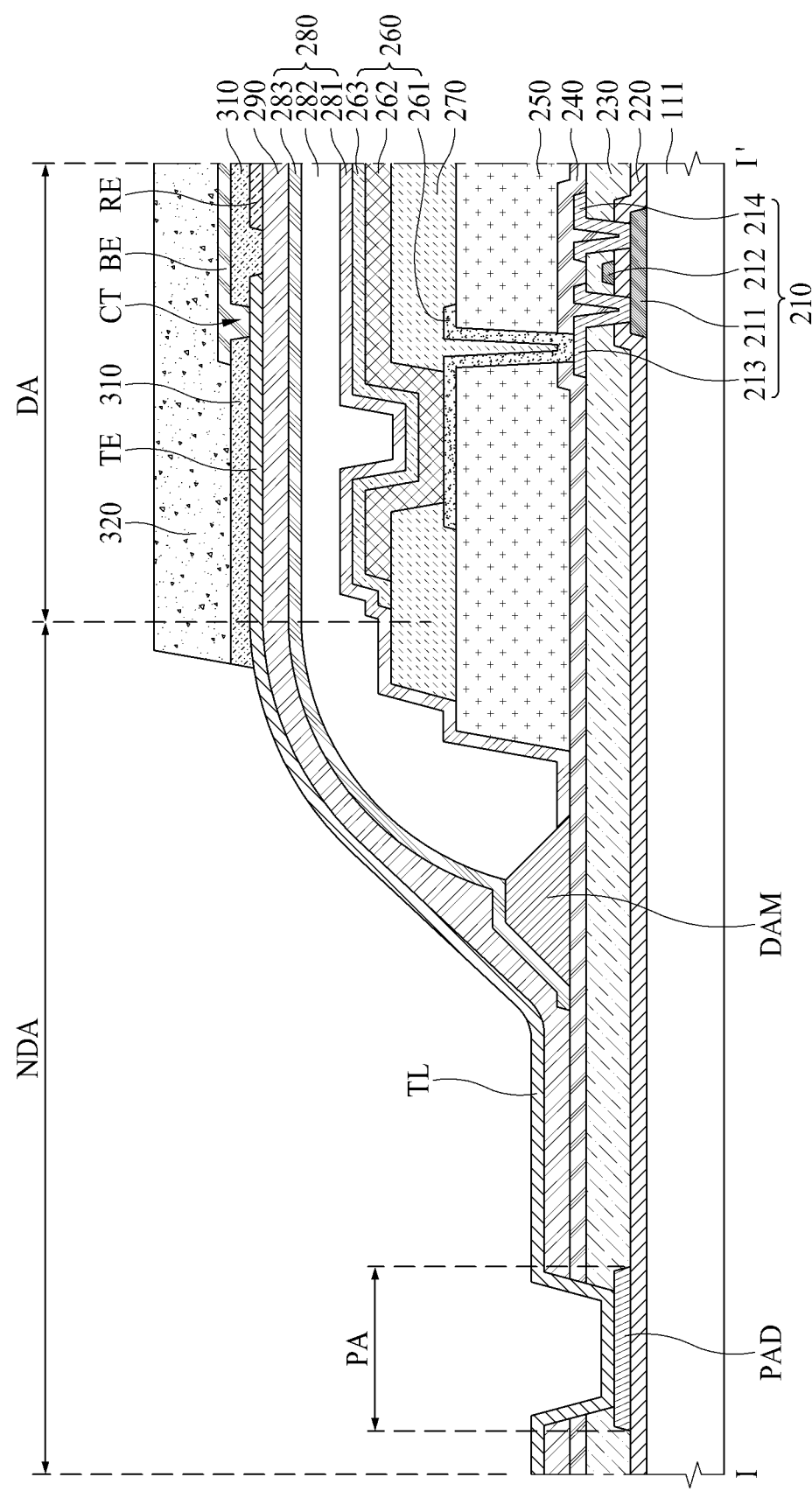
FIG. 6 is a cross-sectional view illustrating one example taken along line I-I' of FIG. 5.

FIG. 4 is a plane view briefly illustrating a first substrate according to an aspect of the present disclosure, FIG. 5 is a plane view illustrating a touch sensing layer arranged on the first substrate in FIG. 4, FIG. 6 is a cross-sectional view illustrating one example taken along line I-I' of FIG. 5, and FIGS. 7 to 9 are cross-sectional views illustrating various examples of a dam.

Referring to FIGS. 4 to 6, the first substrate 111 is categorized into a display area DA and a non-display area NDA, wherein pads PAD are formed at a pad area PA and a dam DAM may be formed on the non-display area NDA.

The thin film transistor layer 10 and the organic light emitting diode layer 20 are formed on the display area DA of the first substrate 11.

The thin film transistor layer 10 includes thin film transistors 210, a gate insulating film 220, an inter-layer dielectric film 230, a passivation film 240, and a planarization film 250.

A buffer film is formed on one surface of the first substrate 111. The buffer film may be formed on one surface of the first substrate 111 to protect the thin film transistors 210 and light emitting diodes 260 from water permeated through the first substrate 111 which is vulnerable to moisture permeability. One surface of the first substrate 111 may be a surface facing the second substrate 112. The buffer film may be made of a plurality of inorganic films which are deposited alternately. For example, the buffer film may be formed of a multi-layered film of one or more inorganic films of a silicon oxide film (SiOx), a silicon nitride film (SiNx) and SiON, which are deposited alternately. The buffer film may be omitted.

The thin film transistor 210 is formed on the buffer film. The thin film transistor 210 includes an active layer 211, a gate electrode 212, a source electrode 213, and a drain electrode 214. Although the thin film transistor 210 is formed in a top gate mode in which the gate electrode 212 is arranged above the active layer 211 as shown in FIG. 6, it is to be understood that the thin film transistor of the present disclosure is not limited to the top gate mode. That is, the thin film transistor 210 may be formed in a bottom gate mode in which the gate electrode 212 is arranged below the active layer 211 or a double gate mode in which the gate electrode 212 is arranged above and below the active layer 211.

The active layer 211 is formed on the buffer film. The active layer 211 may be formed of a silicon based semiconductor material or an oxide based semiconductor material. A light-shielding layer for shielding external light entering the active layer 211 may be formed between the buffer film and the active layer 211.

The gate insulating film 220 may be formed on the active layer 211. The gate insulating film 220 may be formed of an inorganic film, for example, a silicon oxide film (SiOx), a silicon nitride film (SiNx) or a multi-layered film of the silicon oxide film and the silicon nitride film.

The gate electrode 212 and the gate line may be formed on the gate insulating film 220. The gate electrode 212 and the gate line may be formed of a single layer or multi-layer comprised of any one of Mo, Al, Cr, Au, Ti, Ni, Nd and Cu or their alloy.

The inter-layer dielectric film 230 may be formed on the gate electrode 212 and the gate line. The inter-layer dielectric film 230 may be formed of an inorganic film, for example, a silicon oxide film (SiOx), a silicon nitride film (SiNx), or a multi-layered film of the silicon oxide film and the silicon nitride film.

The source electrode 213, the drain electrode 214, and data line may be formed on the inter-layer dielectric film 230. Each of the source electrode 213 and the drain electrode 214 may be connected to the active layer 211 through a contact hole that passes through the gate insulating film 220 and the inter-layer dielectric film 230. The source electrode 213, the drain electrode 214, and data line may be formed of a single layer or multi-layer comprised of any one of Mo, Al, Cr, Au, Ti, Ni, Nd and Cu or their alloy.

The passivation layer 240 may be formed on the source electrode 213, the drain electrode 214, and the data line to insulate the thin film transistor 210. The passivation layer 240 may be formed of an inorganic film, for example, a silicon oxide film (SiOx), a silicon nitride film (SiNx), or a multi-layered film of the silicon oxide film and the silicon nitride film.

The planarization film 250 for planarizing a step difference due to the thin film transistor 210 may be formed on the passivation layer 240. The planarization film 250 may be formed of an organic film such as acrylic resin, epoxy resin, phenolic resin, polyamide resin, and polyimide resin.

The organic light emitting diode layer 20 is formed on the thin film transistor layer 10. The organic light emitting diode layer 20 includes organic light emitting diodes 260 and a bank 270.

The organic light emitting diode 260 and the bank 270 are formed on the planarization film 250. The organic light emitting diode includes the first electrode 261, the organic light emitting layer 262, and the second electrode 263. The first electrode 261 may be an anode electrode, and the second electrode 263 may be a cathode electrode.

The first electrode 261 may be formed on the planarization film 250. The first electrode 261 may be connected to the source electrode 213 of the thin film transistor 210 through a contact hole that passes through the passivation film 240 and the planarization film 250. The first electrode 261 may be formed of conductive material with high reflexibility such as a deposition structure (Ti/Al/Ti) of Al and Ti, a deposition structure (ITO/Al/ITO) of Al and ITO, an APC alloy, or a deposition structure (ITO/APC/ITO) of APC alloy and ITO. The APC alloy is an alloy of Ag, Pd and Cu.

In order to partition pixels P, the bank 270 may be formed on the planarization film 250 to cover an edge of the first electrode 261. That is, the bank 270 serves as a pixel defining film to define pixels. The bank 270 may be formed of an organic film such as acrylic resin, epoxy resin, phenolic resin, polyamide resin, and polyimide resin.

The organic light emitting layer 261 may be formed on the first electrode 261 and the bank 270. The organic light emitting layer 262 may include a hole transporting layer, at least one light emitting layer, and an electron transporting layer. In this case, when a voltage is applied to the first electrode 261 and the second electrode 263, holes and electrons are moved to the light emitting layer through the hole transporting layer and the electron transporting layer, respectively, are combined in the organic light emitting layer, thereby emitting light.

The organic light emitting layer 262 may be formed of a white light emitting layer for emitting white light. In this case, the organic light emitting layer 262 may be formed to cover the first electrode 261 and the bank 270. In this case, a color filter (not shown) may be formed on the second substrate 112.

Otherwise, the organic light emitting layer 262 may be formed of a red light emitting layer for emitting red light, a green light emitting layer for emitting green light, and a blue light emitting layer for emitting blue light. In this case, the organic light emitting layer 262 may be formed on the area corresponding to the first electrode 261 and a color filter may not be formed on the second substrate 112.

The second electrode 263 is formed on the organic light emitting layer 262. In the case that the organic light emitting display device is formed in a top emission structure, the second electrode 263 may be formed of a transparent conductive material (TCO) such as ITO and IZO, which may transmit light, or a semi-transmissive conductive material such as Mg, Ag, and alloy of Mg and Ag. A capping layer may be formed on the second electrode 263.

On the organic light emitting diode layer 20, the encapsulation layer 20 is formed not only on the display area DA but also on the non-display area NDA. The encapsulation layer 30 includes an encapsulation film 280 and a dam DAM.

The encapsulation film 280 serves to prevent oxygen or water from being permeated into the organic light emitting layer 262 and the second electrode 263. To this end, the encapsulation film 280 may include at least one inorganic film and at least one organic film. For example, the encapsulation film 280 may include a first inorganic film 281, an organic film 282, and a second inorganic film 283.

The first inorganic film 281 is placed on the second electrode 263. The first inorganic film 281 may be formed to cover the second electrode 263. The organic film 282 may be formed on the first inorganic film 281. The organic film 282 may be formed with a sufficient thickness to prevent particles from being permeated into the organic light emitting layer 262 and the second electrode 263 by passing through the first inorganic film 281. The second inorganic film 282 may be formed to cover the organic film 282.

Each of the first and second inorganic films 281 and 283 may be formed of silicon nitride, aluminum nitride, zirconium nitride, titanium nitride, hafnium nitride, tantalum nitride, silicon oxide, aluminum oxide, or titanium oxide. The organic film 282 may be formed of acrylic resin, epoxy resin, phenolic resin, polyamide resin, or polyimide resin.

The dam DAM is formed on the non-display area NDA and blocks a flow of the organic film 282 constituting the encapsulation film 280. More specifically, the dam is formed to surround the outside of the display area DA and blocks a flow of the organic film 282 constituting the encapsulation film 280. The dam may also be arranged between the display area DA and a pad area PA to block the flow of the organic film 282 to allow the organic film 282 constituting the encapsulation film 280 not to be permeated into the pad area PA. Therefore, the dam may prevent the organic film 282 from being exposed to the outside of the display device or from being permeated into the pad area PA.

Such a dam DAM includes a first side S1 facing the organic film 282 and a second side S2 which is opposite to the first side S1, wherein at least one of the first side S1 and the second side S2 has an angle smaller than 90°.

Figure 7:
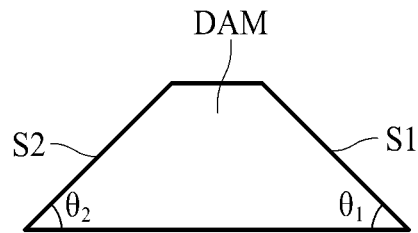
FIG. 7 is a cross-sectional view illustrating one example of a dam.
Figure 8:
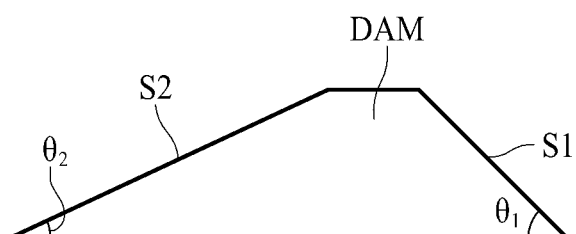
FIG. 8 is a cross-sectional view illustrating another example of a dam.

As shown in FIG. 7, the first side S1 and the second side S2 of the dam may have, but not limited to, the same inclination. The first side S1 and the second side S2 of the dam may have their respective inclinations different from each other, as shown in FIGS. 8 and 9.

The second side S2 of the dam may have an inclination θ2 smaller than 90°, and the inclination θ2 may be smaller than 45°. The second side S2 of the dam may be formed to be inclined to reduce a step difference. Therefore, the present disclosure may provide a more planarized surface when forming the second inorganic film 283 and metal patterns on the dam. Therefore, according to the present disclosure, the second inorganic film 283 may be formed with a constant thickness, and a crack may be prevented from occurring on the area where the dam is in contact with the passivation film 240 due to a step difference. Also, according to the present disclosure, the unnecessary metal can be prevented from remaining as a residual film without being completely removed from the area where the unnecessary metal should not be remained when the metal pattern should be formed on the dam.

The first side S1 of the dam may have the same inclination θ1 as the second side S2 as shown in FIG. 7. In this case, the first side S1 of the dam may have an inclination smaller than 90°, and the inclination may be smaller than 45°.

Figure 9:
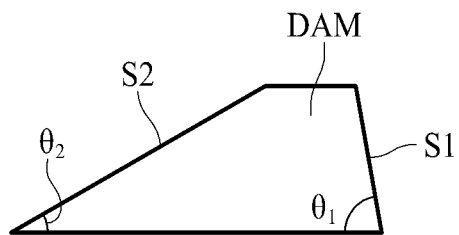
FIG. 9 is a cross-sectional view illustrating other example of a dam.

Meanwhile, the first side S1 of the dam may have an inclination θ1 different from that of the second side S2, as shown in FIG. 9. In this case, the first side S1 of the dam may have an inclination θ1 greater than that of the second side S2 and its inclination may be 90° or less. Since the first side S1 of the dam is covered by the organic film 282 constituting the encapsulation film 280, the second inorganic film 283 and the metal patterns are not formed along on the first side S1 of the dam. That is, the organic film 282 is formed on the area where the first side S1 of the dam and the passivation film 240 are in contact with each other, whereby a step difference can be reduced. Therefore, the first side S1 of the dam may have an inclination of 90° or less. However, in order to minimize a bezel by minimizing a distance between the dam and the display area DA, the first side S1 of the dam may have an inclination greater than the second side S2, for example, an inclination of 90°.

Such a dam may be formed simultaneously with the planarization film 250 or the bank 270 of the pixel P and formed of the same material as that of the planarization film 250 or the bank 270. In this case, the dam may be formed of an organic film such as acrylic resin, epoxy resin, phenolic resin, polyamide resin, and polyimide resin.

Meanwhile, although FIG. 6 shows that the dam is not to be covered by the first inorganic film 281, the present disclosure is not limited to this example. If the first inorganic film 281 covers the display area DA, the first inorganic film 281 may be formed to cover the dam.

The touch sensing layer 40 is formed on the encapsulation layer 30. The touch sensing layer 40 includes first touch electrodes TE, second touch electrodes RE, bridge electrodes BE, an insulating film 310, and a passivation film 320.

A buffer layer 290 is formed on the encapsulation layer 30. The buffer layer 290 is formed to expose a pad from the display area DA and the non-display area NDA. Such a buffer layer 290 is formed to cover the dam. The buffer layer 290 may be omitted.

On the buffer layer 290, the first touch electrodes TE and the second touch electrodes RE are formed in the display area DA. The first touch electrodes TE are arranged in a first direction (y-axis direction) and connected to each other, and the second touch electrodes RE are arranged in a second direction (x-axis direction) and connected to each other. The first direction (y-axis direction) may be parallel with the scan lines S1 to Sn, and the second direction (x-axis direction) may be parallel with the data lines D1 to Dm. Alternatively, the first direction (y-axis direction) may be parallel with the data lines D1 to Dm, and the second direction (x-axis direction) may be parallel with the scan lines S1 to Sn.

Each of the first touch electrodes TE connected in the first direction (y-axis direction) is electrically insulated from the first touch electrodes TE adjacent thereto in the second direction (x-axis direction). Each of the second touch electrodes RE connected in the second direction (x-axis direction) is electrically insulated from the first touch electrodes adjacent thereto in the first direction (y-axis direction).

For this reason, mutual capacitance corresponding to the touch sensor may be formed on the crossed area of the first touch electrode TE and the second touch electrode RE.

Among the first touch electrodes connected with each other in the first direction (y-axis direction), the first touch electrode TE arranged at one end may be connected to the first touch line TL on the non-display area NDA. The first touch line TL may be extended from the first touch electrode TE and then patterned to reach the pad area PA. The first touch line TL may be connected to the pad PAD in the pad area PA and then connected to the first touch driver 181 through the pad PAD. Therefore, the first touch electrodes TE connected with each other in the first direction (y-axis direction) may receive a driving pulse from the first touch driver 181 through the first touch line TL Among the second touch electrodes RE connected with each other in the second direction (x-axis direction), the second touch electrode RE arranged at one end may be connected to the second touch line RL on the non-display area NDA. The second touch line RL may be extended from the second touch electrode RE and then patterned to reach the pad area PA. The second touch line RL may be connected to the pad PAD on the pad area PA and then connected to the second touch driver 182 through the pad PAD. Therefore, the second touch driver 182 may receive amount of charge changes in the touch sensors of the second touch electrodes RE connected with each other in the second direction (x-axis direction).

The insulating film 310 is formed on the first touch electrodes TE and the second touch electrodes RE. The first touch electrodes TE, the second touch electrodes RE, the first touch lines RL and the second touch lines RL may be arranged on the same layer. The insulating film 310 may be formed not only on the first touch electrodes TE and the second touch electrodes RE but also between the first touch electrodes TE and the second touch electrodes RE. Each of the first touch electrodes TE may be insulated from each of the second touch electrodes RE by the insulating film 310

A bridge electrode BE is formed on the insulating film 310. In order to prevent the first touch electrodes TE and the second touch electrodes RE from short-circuiting at their crossing areas, the first touch electrodes adjacent to each other in the first direction (y-axis direction) may be connected electrically through the bridge electrode BE. The bridge electrode BE is formed on a different layer from the first and second touch electrodes TE and RE, and may be connected to the first touch electrodes TE adjacent to each other through contact holes CT. The bridge electrode BE may cross the second touch electrode RE.

In this case, the contact holes CT may be formed to pass through the insulating film 310. The bridge electrode BE is connected to two adjacent first touch electrodes TE through two contact holes CT formed on the insulating film 310, exposing the two adjacent first touch electrodes TE, and connects the two contact holes CT. Therefore, the bridge electrode BE is formed on the insulating film 310.

The passivation film 320 is formed on the insulating film 310 and the bridge electrode BE. The passivation film 320 maintains characteristic stabilization of the display device by blocking harmful conditions from the outside.

According to the aspect of the present disclosure, since the touch sensing layer is directly formed on the encapsulation layer 30, it is not required to align the first substrate 111 and the second substrate 112 when the first substrate 111 and the second substrate 112 are bonded to each other.

As described above, according to the present disclosure, the dam DAM having at least one side with an inclination is formed, whereby a step difference due to the dam DAM is reduced. Therefore, in the present disclosure, the second inorganic film 283 is formed on the dam DAM to have a constant thickness, and a crack can be prevented from occurring. Also, in the present disclosure, a residual layer may be prevented from remaining when metal patterns, for example, the first touch lines TL or the second touch lines RL are formed on the dam DAM.

Also, according to the present disclosure, different inclinations may be formed for the first side S1 and the second side S2. Since the first side S1 of the dam DAM has a reduced step difference by the organic film 282, a distance between the dam and the display area DA may be minimized by forming a steep inclination. Meanwhile, the second side S1 of the dam DAM is formed to have a gentle inclination, whereby the step difference of the dam DAM can be reduced as much as possible. Therefore, an optimal structure can be realized to reduce a step difference of the DAM and minimize a bezel at the same time.

Figure 10:
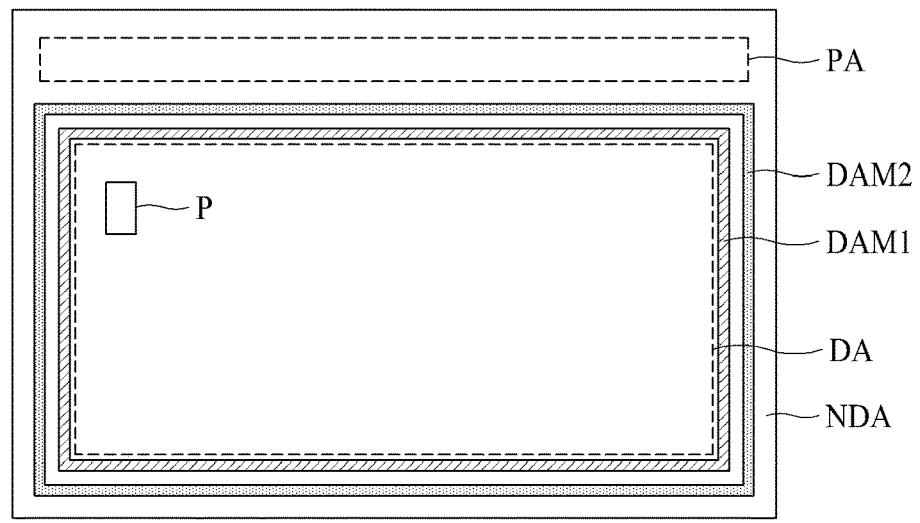
FIG. 10 is a plane view briefly illustrating a first substrate according to another aspect of the present disclosure.
Figure 11:
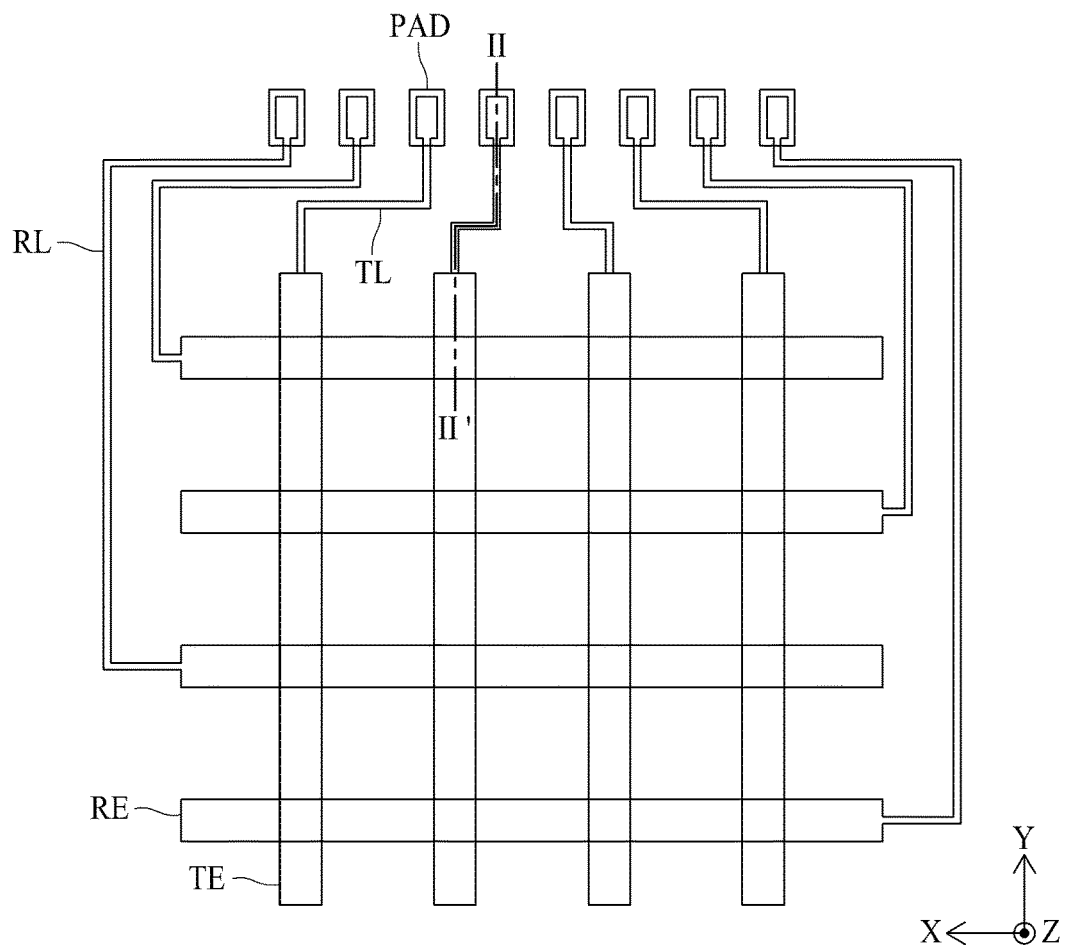
FIG. 11 is a plane view illustrating a touch sensing layer arranged on the first substrate in FIG. 10.
Figure 12:
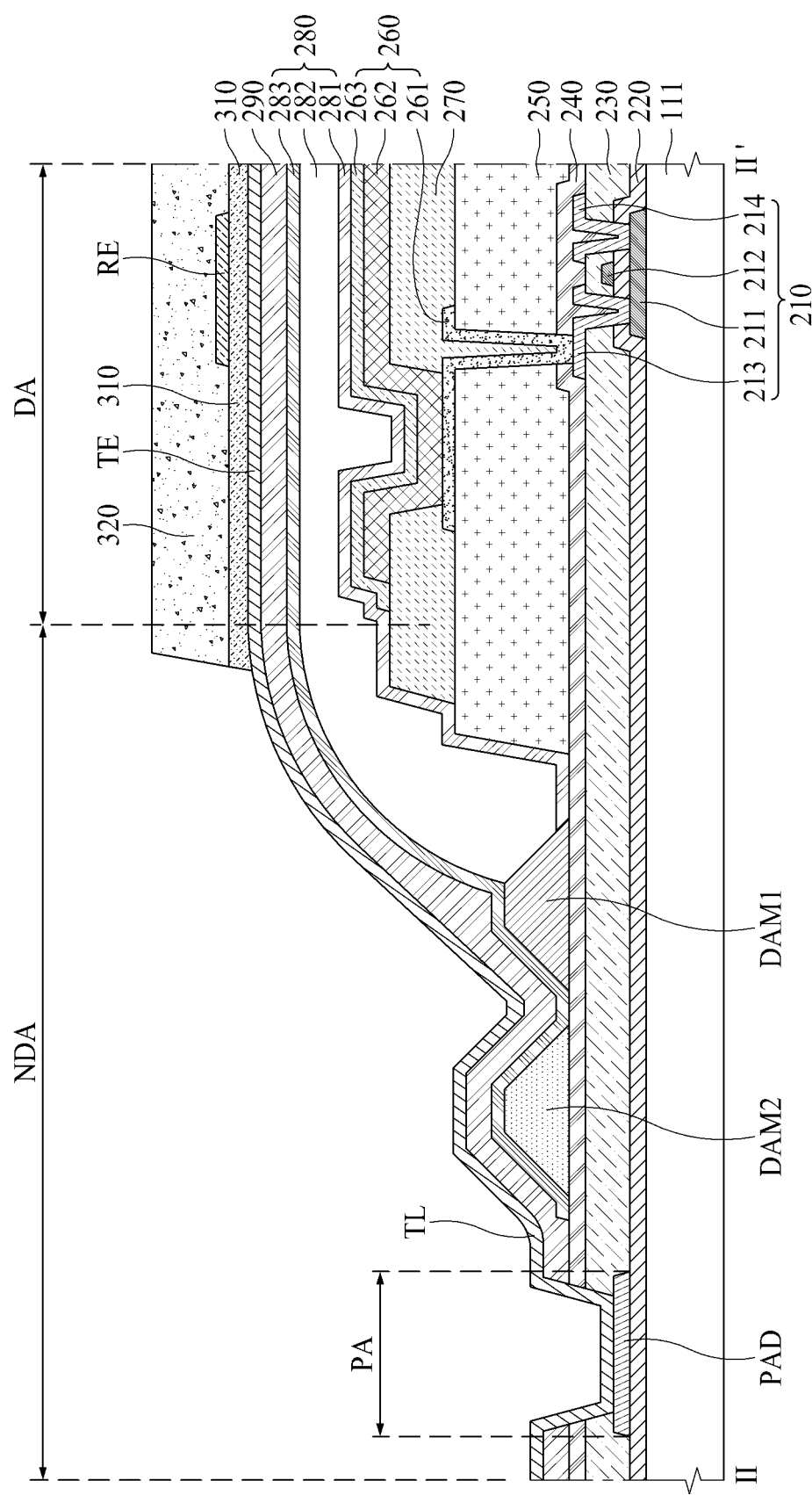
FIG. 12 is a cross-sectional view illustrating one example taken along line II-II' of FIG. 10.

FIG. 10 is a plane view briefly illustrating the first substrate according to another aspect of the present disclosure, FIG. 11 is a plane view illustrating a touch sensing layer arranged on the first substrate in FIG. 10, FIG. 12 is a cross-sectional view illustrating one example taken along line II-II' of FIG. 10, and FIGS. 13 to 15 are cross-sectional views illustrating various examples of a dam.

Referring to FIGS. 10 to 15, the first substrate 111 is categorized into a display area DA and a non-display area NDA, wherein pads PAD are formed at a pad area PA, a first dam DAM1 and a second dam DAM2 may be formed on the non-display area NDA.

The thin film transistor layer 10 and the organic light emitting diode layer 20 are formed on the display area DA of the first substrate 11. Since the thin film transistor layer 10 and the organic light emitting diode layer 20 are the same as those of the first substrate according to the previously described aspect of the present disclosure, their detailed description will be omitted.

On the organic light emitting diode layer 20, the encapsulation layer 30 is formed not only on the display area DA but also on the non-display area NDA. The encapsulation layer 30 includes an encapsulation film 280, the first dam DAM1, and the second dam DAM2.

The encapsulation film 280 serves to prevent oxygen or water from being permeated into the organic light emitting layer 262 and the second electrode 263. To this end, the encapsulation film 280 may include at least one inorganic film and at least one organic film. For example, the encapsulation film 280 may include a first inorganic film 281, an organic film 282, and a second inorganic film 283.

The first inorganic film 281 may be arranged on the second electrode 263. The first inorganic film 281 may be formed to cover the second electrode 263. The organic film 282 may be arranged on the first inorganic film 281. The organic film 282 may be formed with a sufficient thickness to prevent particles from being permeated into the organic light emitting layer 262 and the second electrode 263 by passing through the first inorganic film 281. The second inorganic film 282 may be formed to cover the organic film 282.

Each of the first and second inorganic films 281 and 283 may be formed of a silicon nitride, an aluminum nitride, a zirconium nitride, a titanium nitride, a hafnium nitride, a tantalum nitride, silicon oxide, an aluminum oxide, or a titanium oxide. The organic film 282 may be formed of acrylic resin, epoxy resin, phenolic resin, polyamide resin, or polyimide resin.

The first dam DAM1 and the second dam DAM2 are arranged on the non-display area NDA and block a flow of the organic film 282 constituting the encapsulation film 280. More specifically, the first dam DAM1 may be formed to surround the outside of the display area DA to primarily block a flow of the organic film 282 constituting the encapsulation film 280. Also, the first dam DAM1 may be arranged between the display area DA and a pad area PA and primarily block the flow of the organic film 282 to allow the organic film 282 constituting the encapsulation film 280 not to be permeated into the pad area PA.

Also, the second dam DAM2 may be formed to surround the outside of the first dam DAM1 and secondarily block the organic film 282 overflowing to the outside of the first dam DAM1. Therefore, the first dam DAM1 and the second dam DAM2 may effectively prevent the organic film 282 from being exposed to the outside of the display device or from being permeated into the pad area PA.

The first dam DAM1 includes a first side S1 facing the organic film 282 and a second side S2 facing the second dam DAM2, wherein at least one of the first side S1 and the second side S2 has an inclination smaller than 90°. The second dam DAM2 includes a third side S3 facing the first dam DAM1 and a fourth side S4 which is opposite to the third side S3, wherein at least one of the third side S3 and the fourth side S4 has an inclination smaller than 90°.

Figure 13:
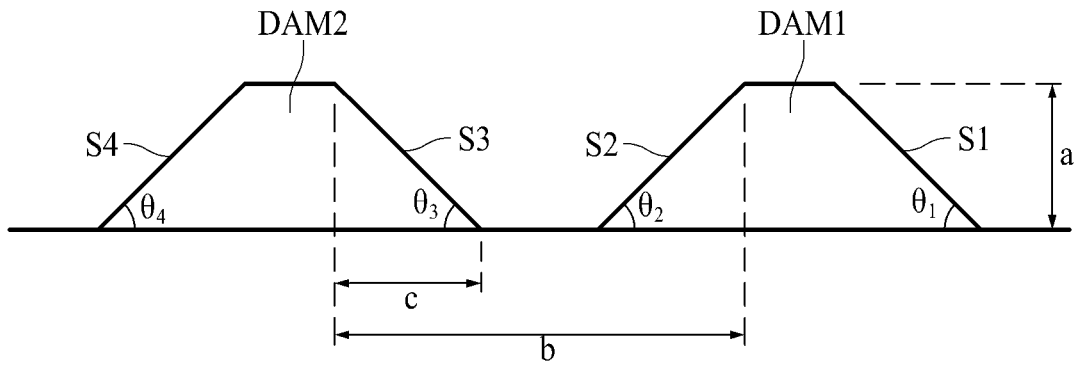
FIG. 13 is a cross-sectional view illustrating one example of first and second dams.
Figure 14:
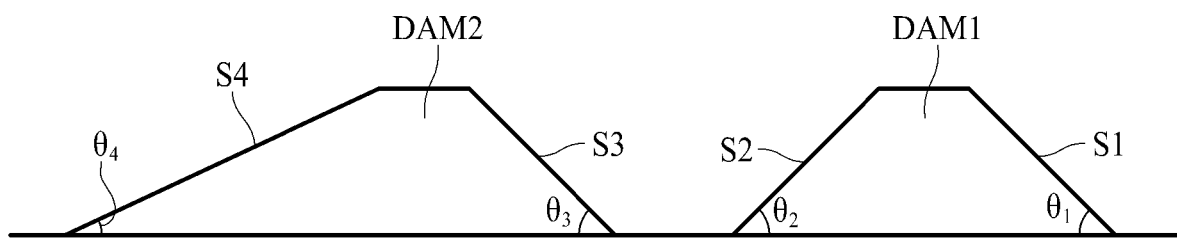
FIG. 14 is a cross-sectional view illustrating another example of first and second dams.

The first side S1 and the second side S2 of the first dam DAM1 may have, but not limited to, the same inclination, as shown in FIGS. 13 and 14. The first side S1 and the second side S2 of the first dam DAM1 may have their respective inclinations different from each other, as shown in FIG. 15.

Figure 15:
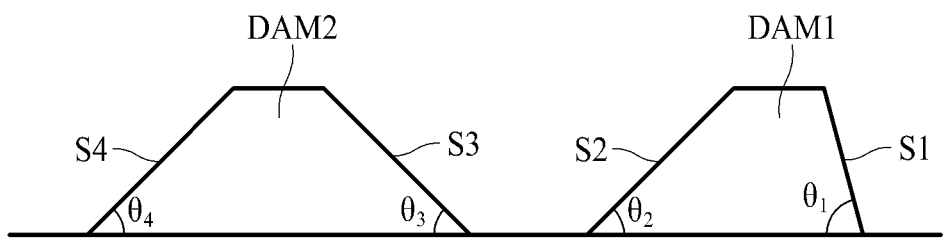
FIG. 15 is a cross-sectional view illustrating other example of first and second dams.

The third side S3 and the fourth side S4 of the second dam DAM2 may have, but not limited to, the same inclination, as shown in FIGS. 13 and 15. The third side S3 and the fourth side S4 of the second dam DAM2 may have their respective inclinations different from each other, as shown in FIG. 14.

The first side S1 and the second side S2 of the first dam DAM1 and the third side S3 and the fourth side S4 of the second dam DAM2 may have the same inclinations, as shown in FIG. 13. In this case, it is preferable that an inclination is in the range of 45° or less to effectively reduce a step difference of the first dam DAM1 and the second dam DAM2. Meanwhile, the first dam DAM1 and the second dam DAM2 are not in contact with each other. This is to prevent water and oxygen from being permeated into the first dam DAM1 through a crack in the case that a crack occurs in the second dam DAM2. Therefore, in the case that the first side S1 and the second side S2 of the first dam DAM1 and the third side S3 and the fourth side S4 of the second dam DAM2 have all the same inclinations, the inclination meets the following Equation 1 below.

$$1 \geq \tan\Theta > \frac{2a}{b}, b > 2c \qquad \text{[Equation 1]}$$

The 'a' denotes a thickness of the first dam DAM1 or a thickness of the second dam DAM2, the 'b' denotes a horizontal distance from a point where an upper surface of the first dam DAM1 is in contact with the second side S2 to a point where an upper surface of the second dam DAM2 is in contact with the third side S3, and the 'c' denotes a horizontal distance from a point where the upper surface of the first dam DAM1 is in contact with the second side S2 to a point where a lower surface is in contact with the second side S2.

Meanwhile, although FIG. 13 shows that the first side S1 and the second side S2 of the first dam DAM1 and the third side S3 and the fourth side S4 of the second dam DAM2 have all the same inclinations, the present disclosure is not limited to this example. As shown in FIG. 14, the fourth side S4 of the second dam DAM2 may be formed to have an inclination θ4 smaller than the first side S1 and the second side S2 of the first dam DAM1 and the third side S3 of the second dam DAM2.

Since the second side S2 of the first dam DAM1 should not be in contact with the third side S3 of the second dam DAM2, a minimum value of inclination is limited. On the other hand, the fourth side S4 of the second dam DAM2 does not have such a limitation unlike the second side S2 of the first dam DAM1 and the third side S3 of the second dam DAM2, and a relatively wide space from the second dam DAM2 to the PAD may be obtained. Therefore, the fourth side S4 of the second dam DAM2 may have an inclination smaller than those of the second side S2 of the first dam DAM1 and the third side S3 of the second dam DAM2, and may reduce a step difference as much as possible.

Meanwhile, although FIG. 13 shows that the first side S1 and the second side S2 of the first dam DAM1 and the third side S3 and the fourth side S4 of the second dam DAM2 have all the same inclinations, the present disclosure is not limited to this example. As shown in FIG. 15, the first side S1 of the first dam DAM1 may be formed to have an inclination θ1 greater than those of the second side S2 of the first dam DAM1 and the third side S3 and the fourth side S4 of the second dam DAM2.

Since the first side S1 of the first dam DAM1 is covered by the organic film 282 constituting the encapsulation film 280, the second inorganic film 283 and metal patterns are not formed along on the first side S1 of the first dam DAM1. That is, the organic film 282 is formed on the area where the first side S1 of the first dam DAM1 and passivation film 240 are in contact with each other, whereby a step difference is reduced by the organic film 282. Therefore, the first side S1 of the first dam DAM1 may have an inclination of 90° and may have an inclination smaller than 90°. In order to minimize a bezel by minimizing a distance between the first dam DAM1 and the display area DA, the first side S1 of the first dam DAM1 may have an inclination greater than that of the second side S2, for example, an inclination of 90°.

Meanwhile, Although FIGS. 13 and 15 show that the second side S2 of the first dam DAM1 and the third side S3 of the second dam DAM2 have the same inclination, the present disclosure is not limited to this example. If the second side S2 of the first dam DAM1 and the third side S3 of the second dam DAM2 are not in contact with each other, they may have their respective inclinations different from each other.

The first dam DAM1 and the second dam DAM2 may be formed simultaneously with the planarization film 250 or the bank 270 of the pixel P, and may be formed of the same material as that of the planarization film 250 or the bank 270. In this case, the dam DAM may be formed of an organic material such as acrylic resin, epoxy resin, phenolic resin, polyamide resin, and polyimide resin.

Meanwhile, although FIG. 12 shows that the first dam DAM1 and the second dam DAM2 are not to be covered by the first inorganic film 281, the present disclosure is not limited to this example. If the first inorganic film 281 covers the display area DA, the first inorganic film 281 may be formed to cover the first dam DAM1 and the second dam DAM2.

The touch sensing layer 40 is formed on the encapsulation layer 30. The touch sensing layer 40 includes a buffer layer 290, first touch electrodes TE, second touch electrodes RE, an insulating film 310, and a passivation film 320.

The buffer layer 290 is formed on the encapsulation layer 30. The buffer layer 290 is formed to expose a pad PAD from the display area DA and the non-display area NDA. Such a buffer layer 290 is formed to cover the first dam DAM1 and the second dam DAM2. The buffer layer 290 may be omitted.

On the buffer layer 290, the first touch electrodes TE and the second touch electrodes RE are formed in the display area DA. The first touch electrodes TE are extended in a first direction (x-axis direction) to have a line shape, and the second touch electrodes RE are extended in a second direction (y-axis direction) to have a line shape. The first direction (x-axis direction) may be parallel with the scan lines S1 to Sn, and the second direction (y-axis direction) may be parallel with the data lines D1 to Dm. Alternatively, the first direction (x-axis direction) may be parallel with the data lines D1 to Dm, and the second direction (y-axis direction) may be parallel with the scan lines S1 to Sn.

Meanwhile, the insulating film 310 is arranged between the first touch electrodes TE and the second touch electrodes RE to electrically insulate the first touch electrodes TE from the second touch electrodes RE. Also, each of the first touch electrodes TE extended in the first direction is electrically insulated from the first touch electrodes TE adjacent thereto in the second direction. Each of the second touch electrodes RE extended in the second direction is electrically insulated from the second touch electrodes adjacent thereto in the first direction.

For this reason, mutual capacitance corresponding to the touch sensor may be formed on the crossed area of the first touch electrode TE and the second touch electrode RE.

Among the first touch electrodes TE connected with each other in the first direction (y-axis direction), the first touch electrode TE arranged at one end may be connected to the first touch line TL on the non-display area NDA. The first touch line TL may be extended from the first touch electrode TE and then patterned to reach the pad area PA. The first touch line TL may be connected to the pad PAD in the pad area PA and then connected to the first touch driver 181 through the pad PAD. Therefore, the first touch electrodes TE connected with each other in the first direction (y-axis direction) may receive a driving pulse from the first touch driver 181 through the first touch line TL Among the second touch electrodes RE connected with each other in the second direction (x-axis direction), the second touch electrode RE arranged at one end may be connected to the second touch line RL on the non-display area NDA. The second touch line RL may be extended from the second touch electrode RE and then patterned to reach the pad area PA. The second touch line RL may be connected to the pad PAD on the pad area PA and then connected to the second touch driver 182 through the pad PAD. Therefore, the second touch driver 182 may receive amount of charge changes in the touch sensors of the second touch electrodes RE connected with each other in the second direction (x-axis direction).

The passivation film 320 is formed on the insulating film 310 and the second touch electrode RE. The passivation film 320 maintains characteristic stabilization of the display device by blocking harmful conditions from the outside In another aspect of the present disclosure, it is described that the touch sensing layer 40 has a structure where the first touch electrode TE and the second touch electrode RE are formed on their respective layers different from each other as shown in FIG. 11, but is not limited to this structure. In the second aspect of the present disclosure, the touch sensing layer 40 may have a structure where the first touch electrode TE and the second touch electrode RE are formed on same layer as shown in FIG. 5.

On the contrary, in the previously described aspect of the present disclosure, the touch sensing layer 40 may have not only the structure shown in FIG. 5 but also the structure shown in FIG. 11.

Figure 16:
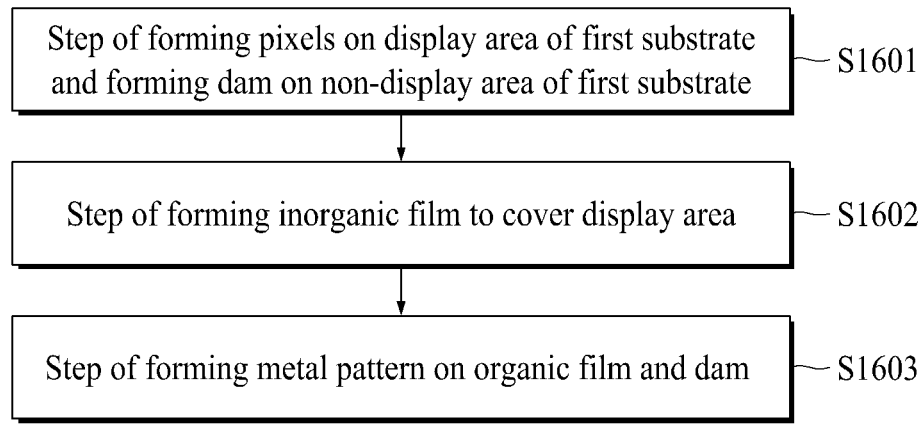
FIG. 16 is a flow chart illustrating a method for manufacturing a display device according to an aspect of the present disclosure.

FIG. 16 is a flow chart view illustrating a method for manufacturing a display device according to an aspect of the present disclosure, and FIGS. 17A to 17E are cross-sectional views illustrating a method for manufacturing a display device according to an aspect of the present disclosure.

First of all, pixels P are formed on the display area DA, and a dam DAM is formed on the non-display area NDA (S1601).

Figure 17A:
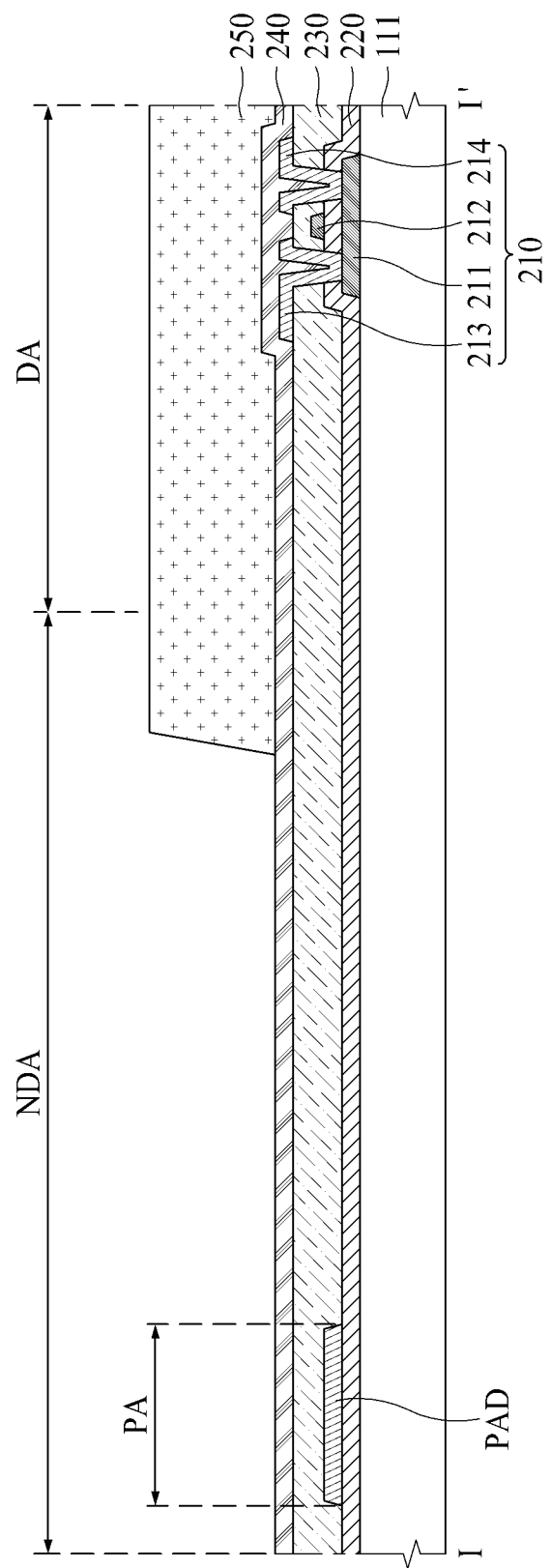
FIGS. 17A to 17E are cross-sectional views illustrating a method for manufacturing a display device according to an aspect of the present disclosure.

In more detail, thin film transistors 210 are formed on the first substrate 111 as shown in FIG. 17A. A buffer film may be formed on the first substrate 111. The buffer film is to protect the thin film transistors 210 and the organic light emitting diode 260 from water permeated through the first substrate 111 which is vulnerable to moisture permeability and may be made of a plurality of inorganic films which are deposited alternately. For example, the buffer film may be formed of a multi-layered film of one or more inorganic films of a silicon oxide film (SiOx), a silicon nitride film (SiNx) and SiON, which are deposited alternately. The buffer film may be formed using a CVD (Chemical Vapor Deposition) method.

Afterwards, the active layer 211 of the thin film transistor is formed on the buffer film. Specifically, an active metal layer is formed on the entire surface of the buffer film using a sputtering method or an MOCVD (Metal Organic Chemical Vapor Deposition) method. Then, the active metal layer is patterned by a mask process using a photoresist pattern to form the active layer 211. The active layer 211 may be formed of a silicon based semiconductor material or an oxide based semiconductor material.

Then, the gate insulating film 220 is formed on the active layer 211. The gate insulating film 220 may be formed of an inorganic film, for example, a silicon oxide film (SiOx), a silicon nitride film (SiNx) or a multi-layered film of the silicon oxide film and the silicon nitride film.

Then, the gate electrode 212 of the thin film transistor 210 is formed on the gate insulating film 220. Specifically, a first metal layer is formed on the entire surface of the gate insulating film 220 using a sputtering method or a MOVCD (Metal Organic Chemical Vapor Deposition) method. Then, the first metal layer is patterned by a mask process using a photoresist pattern to form the gate electrode 212. The gate electrode 212 may be formed of a single layer or multi-layer comprised of any one of Mo, Al, Cr, Au, Ti, Ni, Nd and Cu or their alloy.

Then, an inter-layer dielectric film 230 is formed on the gate electrode 212. The inter-layer dielectric film 230 may be formed of an inorganic film, for example, a silicon oxide film (SiOx), a silicon nitride film (SiNx), or a multi-layered film of the silicon oxide film and the silicon nitride film.

Then, contact holes for exposing the active layer 211 by passing through the gate insulating film 220 and the inter-layer dielectric film 230 are formed.

Then, the source and drain electrodes 213 and 214 of the thin film transistor 210 are formed on the inter-layer dielectric film 230. Specifically, a second metal layer is formed on the entire surface of on the inter-layer dielectric film 230 using a sputtering method or an MOCVD (Metal Organic Chemical Vapor Deposition) method. Then, the second metal layer is patterned by a mask process using a photoresist pattern to form the source and drain electrodes 213 and 214. Each of the source and drain electrodes 213 and 214 may be connected to the active layer 211 through contact holes that pass through the gate insulating film 220 and the inter-layer dielectric film 230. The source and the drain electrodes 213 and 214 may be formed of a single layer or multi-layer comprised of any one of Mo, Al, Cr, Au, Ti, Ni, Nd and Cu or their alloy.

Then, the passivation film 240 is formed on the source and drain electrodes 213 and 214 of the thin film transistor 210. The passivation film 240 may be formed of an inorganic film, for example, a silicon oxide film (SiOx), a silicon nitride film (SiNx), or a multi-layered film of the silicon oxide film and the silicon nitride film. The passivation film 240 may be formed using a CVD method.

Then, the planarization film 250 for planarizing a step difference due to the thin film transistor 210 is formed on the passivation layer 240. The planarization film 250 may be formed of an organic film such as acrylic resin, epoxy resin, phenolic resin, polyamide resin, and polyimide resin.

Figure 17B:
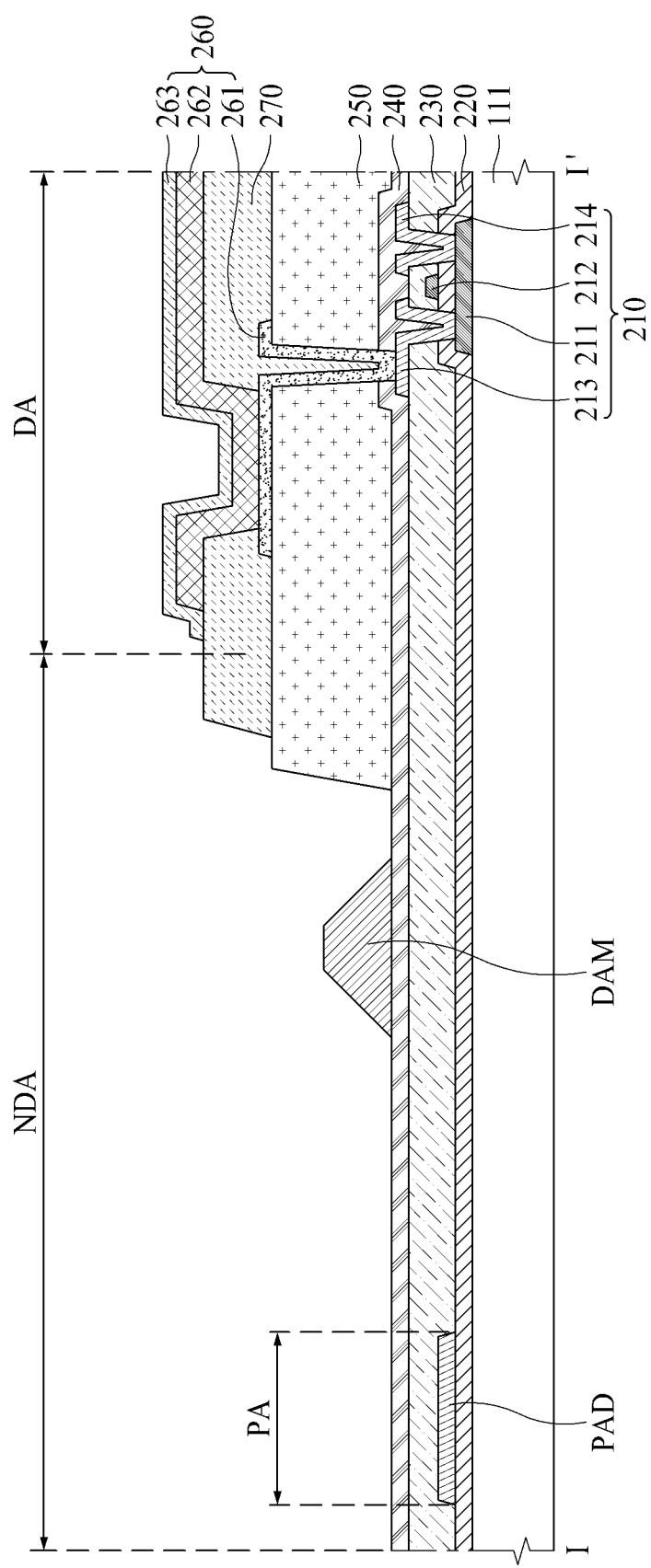

Then, the organic light emitting diode 260 is formed on the planarization film 250 as shown in FIG. 17B. In more detail, the first electrode 261 of the organic light emitting diode 260 is formed on the planarization film 250. A third metal layer is formed on the entire surface of the planarization film 250 using a sputtering method or an MOCVD (Metal Organic Chemical Vapor Deposition) method. Then, the third metal layer is patterned by a mask process using a photoresist pattern to form the source and drain electrodes 213 and 214. The first electrode 261 may be connected to the source electrode 223 through a contact hole that passes through the passivation film 240 and the planarization film 250. The first electrode 261 may be formed of a conductive material with high reflexibility such as a deposition structure (Ti/Al/Ti) of Al and Ti, a deposition structure (ITO/Al/ITO) of Al and ITO, an APC alloy, or a deposition structure (ITO/APC/ITO) of APC alloy and ITO.

Then, in order to partition the pixels P, the bank 270 is formed on the planarization film 250 to cover an edge of the first electrode 261, a dam DAM is also formed together with the bank 270. In this case, the dam DAM is formed on the non-display area NDA. Each of the dam DAM and the bank 270 may be formed of an organic film such as acrylic resin, epoxy resin, phenolic resin, polyamide resin, and polyimide resin.

Particularly, the dam DAM may be formed to have an inclination smaller than 90° through an exposure process using a half tone mask or a slit mask. In more detail, a full tone mask may be arranged in an area where an upper surface of the DAM is to be formed, and a half tone mask or a slit mask may be arranged in an area where an inclined side of the dam DAM is to be formed, whereby the exposure process may be performed to form the dam DAM having an inclination smaller than 90° on at least one side.

Meanwhile, the dam DAM is formed simultaneously with the bank 270 but is not limited to this example. In another aspect, the dam DAM may be formed simultaneously with the planarization film 250.

Then, the organic light emitting layer 261 is formed on the first electrode 261 and the bank 270 by a deposition process or a solution process. Then, the second electrode 263 is formed on the organic light emitting layer 262. The second electrode 263 may be a common layer that is commonly formed on the pixels P. The second electrode 263 may be formed of a transparent conductive material (TCO) such as ITO and IZO, which may transmit light. The second electrode 263 may be formed by physics vapor deposition such as a sputtering method. A capping layer may be formed on the second electrode 263.

Next, the encapsulation film 280 is formed to cover the display area DA (S1602).

Figure 17C:
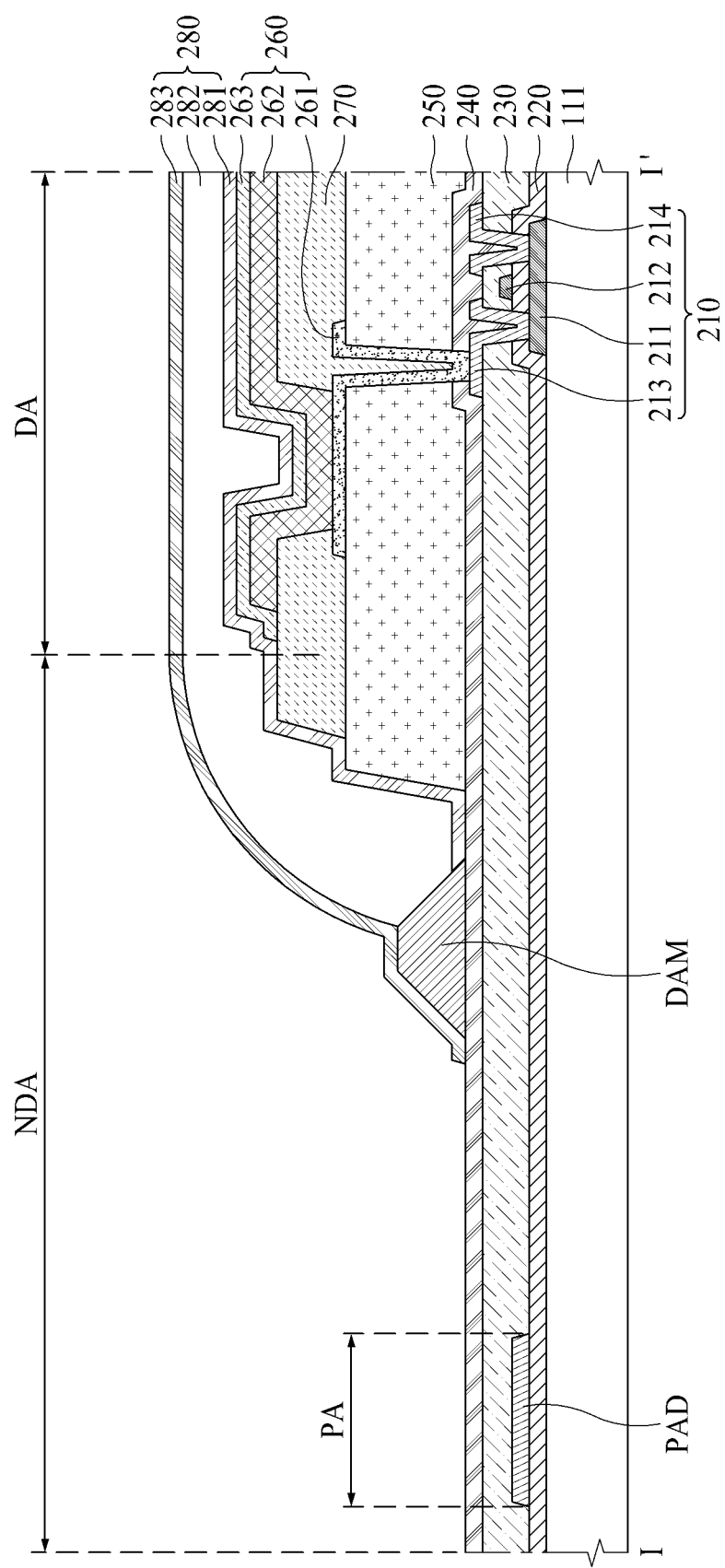

As shown in FIG. 17C, the encapsulation film 280 is formed on the second electrode 263. The encapsulation film 280 serves to prevent oxygen or water from being permeated into the organic light emitting layer 262 and the second electrode 263. To this end, the encapsulation film 280 may include at least one inorganic film and at least one organic film.

For example, the encapsulation film 280 may include a first inorganic film 281, an organic film 282, and a second inorganic film 283. In this case, the first inorganic film 281 is formed to cover the second electrode 263. The organic film 282 is formed to cover the first inorganic film 281. The organic film 282 is preferably formed with a sufficient thickness to prevent particles from being permeated into the organic light emitting layer 262 and the second electrode 263 by passing through the first inorganic film 281. The second inorganic film 282 is formed to cover the organic film 282.

Each of the first and second inorganic films 281 and 283 may be formed of a silicon oxide, a silicon nitride, a silicon nitride, an aluminum oxide, an aluminum nitride, a zirconium nitride, a titanium nitride, a hafnium nitride, a tantalum nitride, or a titanium oxide. The organic film 282 may be formed of acrylic resin, epoxy resin, phenolic resin, polyamide resin, or polyimide resin.

Next, metal patterns, for example, first touch electrodes TE and second touch electrodes RE are formed on the encapsulation film 280 and the dam DAM (S1603).

Figure 17D:
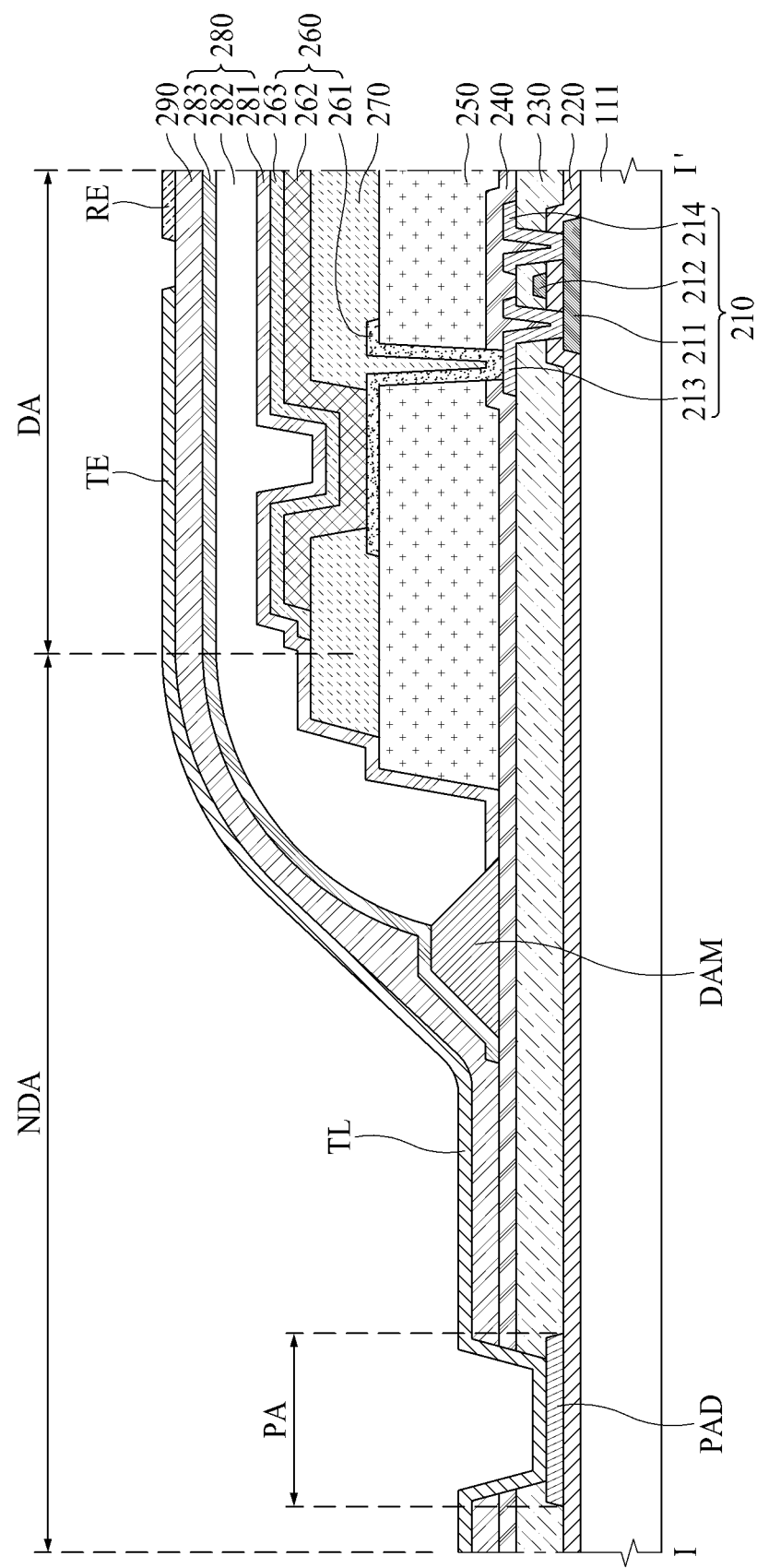

As shown in FIG. 17D, the buffer layer 290 is formed on the encapsulation film 280. After that, the first touch electrodes TE, the second touch electrodes RE, the first touch lines TL, and the second touch lines RL are formed on the buffer layer 290. In more detail, the first touch electrodes TE are arranged in the first direction (y-axis direction) to be spaced apart from each other at a constant space, and the second touch electrodes RE are arranged in the second direction (x-axis direction) to be connected to each other. In this case, each of the first touch electrodes TE and the second touch electrodes RE may have shapes of a rectangle, an octagon, a circle, or a rhombus.

Among the first touch electrodes connected with each other in the first direction (y-axis direction), the first touch electrode TE arranged at one end may be connected to the first touch line TL on the non-display area NDA. The first touch line TL may be extended from the first touch electrode TE and then patterned to reach the pad area PA. The first touch electrode TE and the first touch line TL may be formed on the same layer, and may be formed of the same material.

Among the second touch electrodes RE connected with each other in the second direction (x-axis direction), the second touch electrode RE arranged at one end may be connected to the second touch line RL on the non-display area NDA. The second touch line RL may be extended from the second touch electrode RE and then patterned to reach the pad area PA. The second touch electrode RE and the second touch line RL may be formed on the same layer, and may be formed of the same material.

The first touch electrodes TE, the second touch electrodes RE, the first touch lines TL, and the second touch lines RL may be formed of a transparent conductive material (TCO) such as ITO and IZO, which may transmit light.

A fourth metal layer is formed on the entire surface of the buffer film 290 using a sputtering method or an MOCVD (Metal Organic Chemical Vapor Deposition) method. Then, the fourth metal layer is patterned by a mask process using a photoresist pattern to form the first touch electrodes TE, the second touch electrodes RE, the first touch lines TL, and the second touch lines RL.

Figure 17E:
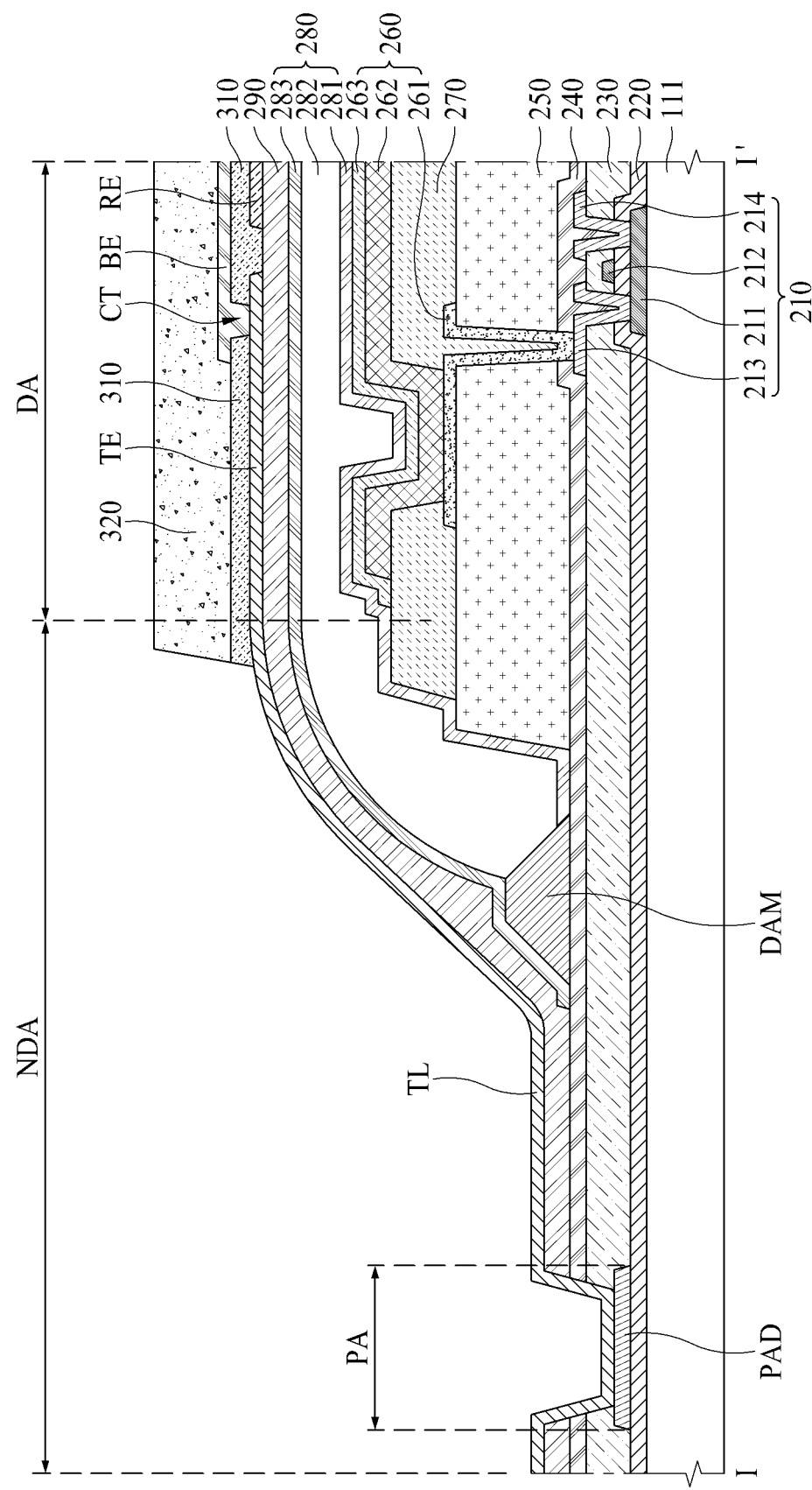

Then, as shown in FIG. 17E, the insulating film 310, the bridge electrodes BE, and the passivation film 320 are formed. In more detail, the insulating film 310 is formed on the first touch electrodes TE and the second touch electrodes RE.

Then, the bridge electrodes BE are formed on the insulating film 310. Contact holes CT for partially exposing the first touch electrodes TE are formed on the insulating film 310, and the bridge electrodes BE are formed on the insulating film 310 by a mask process using a photoresist pattern. The bridge electrodes BE may be electrically connected to their adjacent first touch electrodes TE through the contact holes CT that pass through the insulating film 310.

Then, the passivation film 320 is formed on the entire surface of the first substrate 111.

Although not shown in detail, the first substrate 111 where the passivation film 320 is formed is bonded to the second substrate 112. The first substrate 111 and the second substrate 112 may be bonded to each other in such a manner that the passivation film 320 of the first substrate 111 and the second substrate are adhered to each other using an adhesive layer (not shown). The adhesive layer (not shown) may be an optically clear resin (OCR) or an optically clear adhesive film (OCA).

As described above, according to the present disclosure, the following advantages may be obtained.

According to the aspects of the present disclosure, the touch sensing layer is directly formed on the encapsulation layer and therefore the first substrate and the second substrate need not be aligned when they are bonded each other.

Also, according to the aspects of the present disclosure, since the dam is formed to have at least one side having an inclination, the step difference due to the dam can be reduced. Therefore, the elements formed on the dam may be formed on a more planarized surface.

Also, according to the aspects of the present disclosure, since the inorganic film may be formed on the dam at a constant thickness, a crack can be prevented from occurring.

Also, according to the aspects of the present disclosure, when the metal pattern, for example, the first touch line and the second touch line, are formed on the dam, the residual film can be prevented from remaining.

Also, according to the aspects of the present disclosure, the first side and the second side of the dam have their respective inclinations different from each other, whereby the optimal structure for reducing the step difference and minimizing the bezel at the same time may be realized.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display device comprising:
   a substrate including a display area on which pixels area arranged and a non-display area surrounding the display area;
   an encapsulation film covering the display area, and including an organic film and at least one inorganic film covering the organic film;
   a first dam in contact with the encapsulation film having first and second side surfaces,
   wherein the first side surface is disposed closer to the organic film than second side surface,
   and the second side surface has an inclination smaller than that of the first side surface,
   a metal pattern layer overlapped with the first dam and the at least one inorganic film; and
   a touch sensing layer disposed on the encapsulation film,
   wherein the metal pattern layer is connected electrically to the touch sensing layer, and is extended from the touch sensing layer.

2. The display device of claim 1, wherein the first side surface of the first dam has an inclination larger than 0° and smaller than 90° with respect to the substrate.

3. The display device of claim 2, wherein the second side surface of the first dam has an inclination larger than 0° and equal to or smaller than 45° with respect to the substrate.

4. The display device of claim 1, further comprising a second dam disposed outside the first dam.

5. The display device of claim 4, wherein the at least one inorganic film covers the first dam and the second dam.

6. The display device of claim 5, wherein the second dam includes third and fourth side surfaces, wherein the fourth side surface faces the first dam and is an opposite side of the third side surface, and the second side surface and the third side surface are spaced apart from each other at an inclination larger than 0° and equal to or smaller than 45° with respect to the substrate.

7. The display device of claim 6, wherein the fourth side surface has an inclination smaller than those of the first to third side surfaces.

8. The display device of claim 1, wherein the touch sensing layer is including first touch electrodes, second touch electrodes, and bridge electrodes electrically connecting the first touch electrodes.

9. The display device of claim 8, wherein first touch electrodes and second touch electrodes are on the same layer.

10. The display device of claim 8, further comprising an insulation layer disposed between the encapsulation film and the touch sensing layer.

* * * * *